United States Patent
Kang et al.

(10) Patent No.: US 9,935,037 B2
(45) Date of Patent: Apr. 3, 2018

(54) MULTI-STACKED DEVICE HAVING TSV STRUCTURE

(71) Applicant: SAMSUNG ELECTRONICS CO., LTD., Suwon-si, Gyeonggi-do (KR)

(72) Inventors: Pil-kyu Kang, Hwaseong-si (KR); Ho-jin Lee, Seoul (KR); Byung-lyul Park, Seoul (KR); Tae-yeong Kim, Yongin-si (KR); Seok-ho Kim, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/408,977

(22) Filed: Jan. 18, 2017

(65) Prior Publication Data

US 2017/0207158 A1 Jul. 20, 2017

(30) Foreign Application Priority Data

Jan. 19, 2016 (KR) .................. 10-2016-0006566

(51) Int. Cl.
*H01L 23/48* (2006.01)
*H01L 21/768* (2006.01)
*H01L 25/065* (2006.01)
*H01L 23/00* (2006.01)
*H01L 23/498* (2006.01)

(52) U.S. Cl.
CPC ...... *H01L 23/481* (2013.01); *H01L 21/76879* (2013.01); *H01L 21/76898* (2013.01); *H01L 23/49811* (2013.01); *H01L 23/49822* (2013.01); *H01L 23/49838* (2013.01); *H01L 24/09* (2013.01); *H01L 24/17* (2013.01); *H01L 25/0657* (2013.01); *H01L 2224/08146* (2013.01); *H01L 2224/16146* (2013.01); *H01L 2225/06548* (2013.01)

(58) Field of Classification Search
None
See application file for complete search history.

(56) References Cited

U.S. PATENT DOCUMENTS

| | | | |
|---|---|---|---|
| 7,820,521 | B2 | 10/2010 | Andry et al. |
| 7,884,015 | B2 | 2/2011 | Sulfridge |
| 7,897,509 | B2 | 3/2011 | Tanaka et al. |
| 8,110,900 | B2 | 2/2012 | Yoshimura et al. |

(Continued)

*Primary Examiner* — Joseph Schoenholtz
(74) *Attorney, Agent, or Firm* — Lee & Morse, P.C.

(57) ABSTRACT

A multi-stacked device includes a lower device having a lower substrate, a first insulating layer on the lower substrate, and a through-silicon-via (TSV) pad on the first insulating layer, an intermediate device having an intermediate substrate, a second insulating layer on the intermediate substrate, and a first TSV bump on the second insulating layer, an upper device having an upper substrate, a third insulating layer on the upper substrate, a second TSV bump on the third insulating layer, and a TSV structure passing through the upper substrate, the third insulating layer, the second insulating layer, and the intermediate substrate to be connected to the first TSV bump, the second TSV bump, and the TSV pad. An insulating first TSV spacer between the intermediate substrate and the TSV structure and an insulating second TSV spacer between the upper substrate and the TSV structure are spaced apart along a stacking direction.

20 Claims, 23 Drawing Sheets

(56) References Cited

U.S. PATENT DOCUMENTS

| | | |
|---|---|---|
| 8,742,596 B2 | 6/2014 | Hirano |
| 8,809,188 B2 | 8/2014 | Tezcan et al. |
| 8,836,140 B2 * | 9/2014 | Ma ................... H01L 21/76898 257/71 |
| 8,946,898 B2 | 2/2015 | Takahashi et al. |
| 9,780,136 B2 * | 10/2017 | Kwon ............... H01L 27/14634 |
| 2010/0225002 A1 * | 9/2010 | Law .................. H01L 21/76898 257/774 |
| 2011/0309520 A1 * | 12/2011 | Inagaki ............. H01L 21/76898 257/774 |
| 2013/0020468 A1 | 1/2013 | Mitsuhashi et al. |
| 2013/0093091 A1 * | 4/2013 | Ma ................... H01L 21/76898 257/751 |
| 2013/0285055 A1 * | 10/2013 | Takayanagi ............. H01L 22/34 257/48 |
| 2013/0316530 A1 * | 11/2013 | Law ..................... H01L 23/481 438/637 |
| 2014/0054743 A1 | 2/2014 | Hurwitz et al. |
| 2015/0221695 A1 | 8/2015 | Park et al. |

\* cited by examiner (a)   (b)

(a)　　　　　　　　　　(b)

MULTI-STACKED DEVICE HAVING TSV STRUCTURE

CROSS-REFERENCE TO RELATED APPLICATION

Korean Patent Application No. 10-2016-0006566, filed on Jan. 19, 2016, in the Korean Intellectual Property Office, and entitled: "Multi-Stacked Device Having TSV Structure," is incorporated by reference herein in its entirety.

BACKGROUND

1. Field

Embodiments relate to a multi-stacked device having a through-silicon via (TSV) structure.

2. Description of the Related Art

Research into a multi-stacked device in which a plurality of semiconductor devices are stacked to form a system has been conducted in various ways. For example, a multi-stacked semiconductor device in which an image sensor, a logic device, and a memory device are stacked to form a system has been offered. Semiconductor devices in the multi-stacked device have to be electrically connected to each other. As a method of electrically connecting the semiconductor devices in the multi-stacked device, using a through-silicon via (TSV) structure, which is stable and has the fastest response speed, has been offered. However, a highly advanced photolithography technology and an etching technology are required to form a TSV structure that vertically passes through at least two semiconductor devices. In particular, it is very difficult to form a TSV structure that passes through semiconductor substrates of tens of micrometers to hundreds of micrometers in thickness and multiple insulating layers.

SUMMARY

Embodiments provide a multi-stacked device having a through-silicon via (TSV) structure.

Other embodiments provide a method of forming a multi-stacked device having a TSV structure.

In accordance with an aspect of an embodiment, a multi-stacked device includes a lower device having a lower substrate, a first insulating layer on the lower substrate, and a through-silicon via (TSV) pad on the first insulating layer, an intermediate device having an intermediate substrate, a second insulating layer on the intermediate substrate, and a first TSV bump on the second insulating layer, an upper device having an upper substrate, a third insulating layer on the upper substrate, and a second TSV bump on the third insulating layer, and a TSV structure configured to pass through the upper substrate, the third insulating layer, the second insulating layer, and the intermediate substrate to be connected with the first TSV bump, the second TSV bump, and the TSV pad. The intermediate device includes an insulating first TSV spacer between the intermediate substrate and a lower portion of the TSV structure. The upper device includes an insulating second TSV spacer between the upper substrate and an upper portion of the TSV structure. A side surface of the TSV structure is in direct contact with the second insulating layer and the third insulating layer.

In accordance with another aspect of an embodiment, a multi-stacked device includes a lower device having a lower substrate, a plurality of first insulating layers on the lower substrate, and a TSV pad on the first insulating layers, an intermediate device having an intermediate substrate, an insulating first TSV spacer configured to pass through the intermediate substrate, a plurality of second insulating layers on the intermediate substrate, and a first TSV bump on the second insulating layers, an upper device having an upper substrate, an insulating second TSV spacer configured to pass through the upper substrate, a plurality of third insulating layers on the upper substrate, and a second TSV bump on the third insulating layers, and a TSV structure configured to pass through the upper substrate, the plurality of third insulating layers, the plurality of second insulating layers, and the intermediate substrate to be in contact with the second TSV bump and the TSV pad. The first TSV spacer electrically insulates the intermediate substrate from the TSV structure, and the second TSV spacer electrically insulates the upper substrate from the TSV structure. The first TSV structure and the second TSV structure are spaced apart from each other.

In accordance with still another aspect of an embodiment, a multi-stacked device includes a lower device having a lower substrate, a first insulating layer on the lower substrate, and a through-silicon via (TSV) pad on the first insulating layer, an intermediate device having an intermediate substrate, a second insulating layer on the intermediate substrate, and a first TSV bump on the second insulating layer, an upper device having an upper substrate, a third insulating layer on the upper substrate, and a second TSV bump on the third insulating layer, and a TSV structure configured to passes through the upper substrate, the third insulating layer, the second insulating layer, and the intermediate substrate to be electrically connected with the first TSV bump, the second TSV bump, and the TSV pad. The intermediate device includes an insulating first TSV spacer between the intermediate substrate and the TSV structure, the upper device includes an insulating second TSV spacer between the upper substrate and the TSV structure. The third insulating layer is between the first TSV spacer and the second TSV spacer which are vertically spaced apart from each other.

In accordance with yet another aspect of an embodiment, a multi-stacked device, includes a lower device including a lower substrate, a first insulating layer on the lower substrate, and a through-silicon via (TSV) pad on the first insulating layer, an intermediate device including an intermediate substrate, a second insulating layer on the intermediate substrate, and a first TSV bump on the second insulating layer, an upper device including an upper substrate, a third insulating layer on the upper substrate, and a second TSV bump on the third insulating layer, a TSV structure passing through the upper substrate, the third insulating layer, the second insulating layer, and the intermediate substrate to be electrically connected to the first TSV bump, the second TSV bump, and the TSV pad, an insulating first TSV spacer between the intermediate substrate and the TSV structure, and an insulating second TSV spacer between the upper substrate and the TSV structure. The first TSV spacer and the second TSV spacer may be discontinuous.

BRIEF DESCRIPTION OF THE DRAWINGS

Features will become apparent to those of skill in the art by describing in detail exemplary embodiments with reference to the attached drawings in which.

Figure 1A:
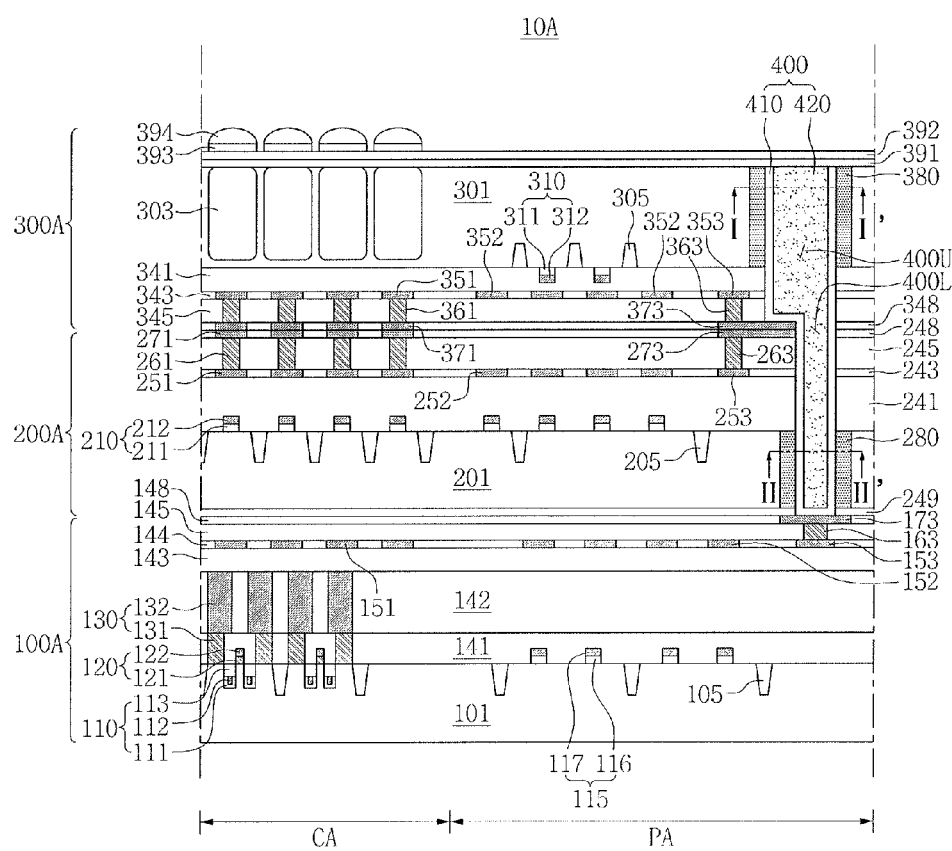
FIGS. 1A to 1F illustrate longitudinal sectional views of multi-stacked devices according to various embodiments.
Figure 3A:
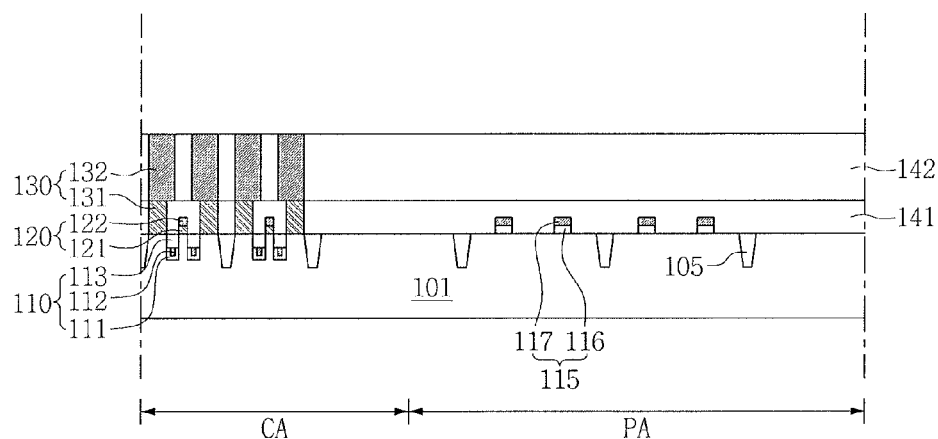
Figure 3B:
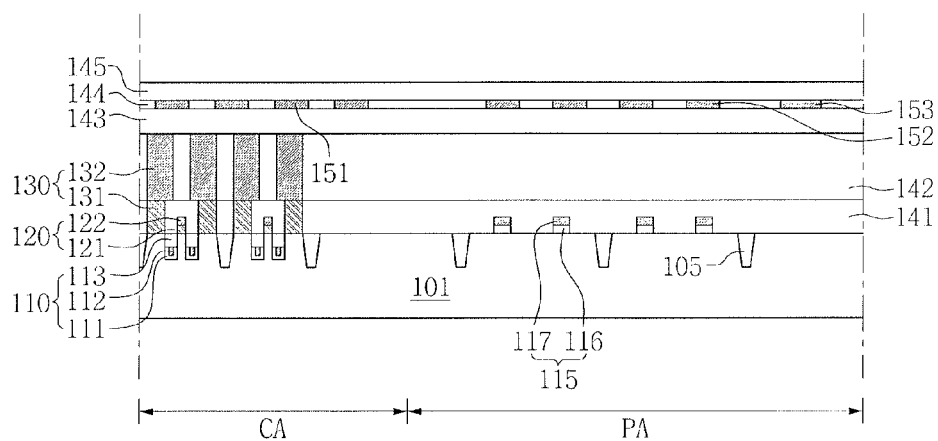
Figure 3C:
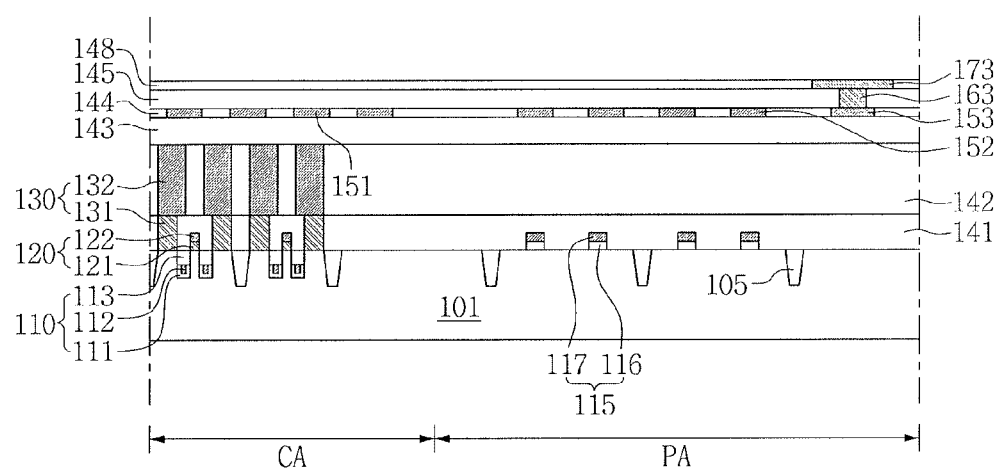

structures according to various embodiments, which are taken along lines I-I' and II-II' of FIG. 1A;

FIGS. 3A to 3C illustrate stages in a method of forming a lower device according to one embodiment;

FIGS. 4A to 4G illustrate stages in a method of forming an intermediate device according to one embodiment;

FIGS. 5A to 5G illustrate stages in a method of forming an upper device according to one embodiment; and FIGS. 6A to 6D illustrate stages in a method of forming a multi-stacked device by stacking the lower device, the intermediate device, and the upper device according to one embodiment.

DETAILED DESCRIPTION

FIGS. 1A to 1F are longitudinal sectional views conceptually illustrating multi-stacked devices (10A to 10F) according to various embodiments.

Referring to FIG. 1A, a multi-stacked device 10A in accordance with one embodiment may include a lower device 100A, an intermediate device 200A, and an upper device 300A which are multi-stacked, and a through-silicon via (TSV) structure 400 that passes through the upper device 300A and the intermediate device 200A to electrically connect the lower device 100A, the intermediate device 200A, and the upper device 300A. For example, the lower device 100A may include a memory, e.g., a dynamic random access memory (DRAM), the intermediate device 200A may include a logic device, e.g., a microprocessor, and the upper device 300A may include a sensor, e.g., an image sensor.

The lower device 100A may include a plurality of isolation regions 105 and buried cell gate structures 110 formed in a lower substrate 101, and peripheral gate structures 115, bit line structures 120, insulating layers 141 to 145, storage structures 130, lower metal layers 151 to 153, a lower TSV via plug 163, a lower TSV pad 173, and a lower passivation layer 148 formed on the lower substrate 101. The cell gate structures 110, the bit line structures 120, and the storage structures 130 may be in a cell area CA, and the peripheral gate structures 115, the lower TSV via plug 163 and the lower TSV pad 173 may be in a peripheral area PA. The insulating layers 141 to 145 may include a lower interlayer insulating layer 141, a molding insulating layer 142, an intermediate interlayer insulating layer 143, a capping insulating layer 144, and an upper interlayer insulating layer 145.

The lower substrate 101 may include one of semiconductor substrates such as a silicon wafer, a silicon germanium wafer, and a silicon on insulator (SOI) wafer. The isolation regions 105 may include silicon oxide filled in a trench. For example, the isolation regions 105 may have a shape of a shallow trench isolation (STI).

Each of the cell gate structures 110 may include a cell gate insulating layer 111, a cell gate electrode 112, and a cell gate capping layer 113 which are formed in a gate trench. The cell gate insulating layer 111 may be conformally formed on an inner wall of the gate trench, and a lower surface and a side surface of the cell gate electrode 112 may be surrounded by the cell gate insulating layer 111. The cell gate capping layer 113 may be formed on the cell gate insulating layer 111 and the cell gate electrode 112 to fill the gate trench. The cell gate insulating layer 111 may include silicon oxide or a metal oxide, and the cell gate electrode 112 may include a conductive metal barrier material and a metal electrode material. The cell gate capping layer 113 may include silicon nitride.

Each of the peripheral gate structures 115 may include a peripheral gate insulating layer 116 and a peripheral gate electrode 117 which are formed on the lower substrate 101. The peripheral gate insulating layer 116 may include silicon oxide or a metal oxide, and the peripheral gate electrode 117 may include a conductive metal barrier material and a metal electrode material.

The bit line structures 120 may be formed between the cell gate structures 110 on the lower substrate 101. Each of the bit line structures 120 may include a bit line contact plug 121 and a bit line electrode 122. The bit line contact plug 121 may include a conductor such, e.g., a doped silicon, a metal, a metal silicide, or a metal compound. The bit line electrode 122 may include a conductor such as a metal, a metal alloy, or a metal compound.

Each of the storage structures 130 may include a storage contact plug 131 and a storage node 132. The storage contact plugs 131 may perpendicularly pass, i.e., along a stacking direction, through the lower interlayer insulating layer 141 to electrically connect the lower substrate 101 and the storage nodes 132. The storage contact plugs 131 may include a doped silicon, a metal, or metal compound. The storage nodes 132 may perpendicularly pass through the molding insulating layer 142 to be connected with the storage contact plugs 131. The storage nodes 132 may include a doped silicon or a metal.

The lower interlayer insulating layer 141 may cover the bit line structures 120 and the peripheral gate structures 115, and surround side surfaces of the storage contact plugs 131. The molding insulating layer 142 may surround side surfaces of the storage nodes 132. The lower interlayer insulating layer 141 may be coplanar with the storage contact plugs 131, and the molding insulating layers 142 may be coplanar with the storage nodes 132. The intermediate interlayer insulating layer 143 may be formed between the molding insulating layer 142 and the lower metal layers 151 to 153. The lower interlayer insulating layer 141, the molding insulating layer 142, and the intermediate interlayer insulating layer 143 may include silicon oxide or silicon nitride.

The lower metal layers 151 to 153 may be formed on the intermediate interlayer insulating layer 143. For example, the lower metal layers 151 to 153 may include a lower cell metal layer 151 in the cell area CA, and a lower peripheral metal layer 152 and a lower TSV interconnection 153 in the peripheral area PA. The lower metal layers 151, 152, and 153 may include an interconnection shape, e.g., having a horizontal extension, a circular pad shape, or a polygonal pad shape.

The capping insulating layer 144 may surround side surfaces of the lower metal layers 151 to 153 and/or be coplanar with the lower metal layers 151 to 153. The capping insulating layer 144 may include silicon nitride or silicon oxide. The upper interlayer insulating layer 145 may cover the capping insulating layer 144 and the lower metal layers 151 to 153. The upper interlayer insulating layer 145 may include silicon oxide, silicon nitride, or a combination thereof.

The lower TSV via plug 163 may pass through the upper interlayer insulating layer 145 to connect the lower TSV interconnection 153 with the lower TSV pad 173. The lower TSV via plug 163 may include a metal or a metal compound.

The lower TSV pad 173 may be arranged with the lower TSV interconnection 153 and the lower TSV via plug 163. The lower TSV pad 173 may include a metal, e.g., copper (Cu).

The lower passivation layer 148 may surround surfaces of the lower TSV pad 173. The lower passivation layer 148 may be coplanar with the lower TSV pad 173. The lower passivation layer 148 may include silicon oxide to be bonded to the intermediate device 200A.

The intermediate device 200A may include a plurality of isolation regions 205 and a lower TSV spacer 280 in an intermediate substrate 201, and logic gate structures 210, insulating layers 241, 243, and 245; intermediate metal layers 251 to 253, intermediate via plugs 261 and 263, intermediate bumps 271 and 273, and an intermediate passivation layer 248 on the intermediate substrate 201, and a back surface passivation layer 249. The insulating layers 241 to 245 may include a lower interlayer insulating layer 241, an intermediate interlayer insulating layer 243, and an upper interlayer insulating layer 245. The intermediate metal layers 251 to 253 may include an intermediate cell metal layer 251 in the cell area CA, and an intermediate peripheral metal layer 252 and an intermediate TSV interconnection 253 in the peripheral area PA. The intermediate via plugs 261 and 263 may include intermediate cell via plugs 261 and an intermediate TSV via plug 263. The intermediate bumps 271 and 273 may include intermediate cell bumps 271 in the cell area CA and an intermediate TSV bump 273 in the peripheral area PA.

The intermediate substrate 201 may include a semiconductor substrate including silicon, silicon germanium, or an SOI. The isolation regions 205 may include silicon oxide and have a shape of an STI.

The lower TSV spacer 280 may be formed between the intermediate substrate 201 and the TSV structure 400. For example, the lower TSV spacer 280 may be formed only in the intermediate substrate 201. The lower TSV spacer 280 may include an insulating material, e.g., silicon oxide or silicon nitride. The lower TSV spacer 280 may surround a part of side surfaces of the TSV structure 400 to electrically insulate the TSV structure 400 from a bulk area of the intermediate substrate 201.

Each of the logic gate structures 210 may include a logic gate insulating layer 211 and a logic gate electrode 212 on the intermediate substrate 201. The logic gate insulating layer 211 may include silicon oxide or a metal oxide. The logic gate electrode 212 may include a metal oxide or a metal.

The lower interlayer insulating layer 241 may cover the logic gate structures 210.

The intermediate metal layers 251 to 253 may include the intermediate cell metal layer 251 in the cell area CA, and the intermediate peripheral metal layer 252 and the intermediate TSV interconnection 253 in the peripheral area PA. The intermediate metal layers 251 to 253 may have an interconnection shape and/or a pad shape. The intermediate metal layers 251 to 253 may include a metal or a metal compound.

The intermediate interlayer insulating layer 243 may surround side surfaces of the intermediate metal layers 251 to 253. The intermediate interlayer insulating layer 243 may include silicon nitride or silicon oxide.

The upper interlayer insulating layer 245 may be on the intermediate interlayer insulating layer 243 and the intermediate metal layers 251 to 253. The upper interlayer insulating layer 245 may include silicon oxide, silicon nitride, or a combination thereof.

The intermediate via plugs 261 and 263 that perpendicularly pass through the upper interlayer insulating layer 245 may include the intermediate cell via plugs 261 connected to the intermediate cell metal layer 251, and the intermediate TSV via plug 263 connected to the intermediate TSV interconnection 253.

The intermediate bumps 271 and 273 may include the intermediate cell bumps 271 on the intermediate cell via plugs 261 and the intermediate TSV bump 273 on the intermediate TSV via plug 263. The intermediate via plugs 261 and 263, and the intermediate bumps 271 and 273 may include a metal, e.g., copper (Cu) or tungsten (W), or a metal compound.

The intermediate passivation layer 248 may surround side surfaces of the intermediate bumps 271 and 273. The intermediate passivation layer 248 may include silicon oxide to be bonded to the upper device 300A.

The back surface passivation layer 249 may be formed on the bottom surface of the intermediate substrate 201. The back surface passivation layer 249 may include silicon oxide to be bonded to the lower passivation layer 148 of the lower device 100A.

The upper device 300A may include photodiodes 303, isolation regions 305, and an upper TSV spacer 380 in an upper substrate 301; transistors 310, insulating layers 341, 343 and 345, metal layers 351 to 353, upper via plugs 361 and 363, upper bumps 371 and 373, and an upper passivation layer 348 on a bottom surface of the upper substrate 301, i.e., a surface facing the intermediate device 200A; and an anti-reflection layer 391, a device capping layer 392, color filters 393, and micro lenses 394 on a top surface of the upper substrate 301. The upper device 300A may be disposed so that the upper substrate 301 faces upward and the insulating layers 341, 343, and 345 face downward, i.e., the insulating layers 341, 343, and 345 are between the upper substrate 301 and the intermediate device 200A.

The upper substrate 301 may include a semiconductor layer including silicon, silicon germanium, or an SOI. The isolation regions 305 may include silicon oxide and have a shape of an STI. Each of the photodiodes 303 may include n-doped regions and p-doped regions.

The upper TSV spacer 380 may be between the upper substrate 301 and the TSV structure 400. For example, the upper TSV spacer 380 may be formed only in the upper substrate 301. The upper TSV spacer 380 may include an insulating material such as silicon oxide or silicon nitride. The upper TSV spacer 380 may surround a part of the side surfaces of the TSV structure 400 to electrically insulate the TSV structure 400 from a bulk area of the upper substrate 301.

The lower TSV spacer 280 and the upper TSV spacer 380 may be vertically spaced apart from each other, i.e., separated along the stacking direction. In other words, the lower TSV spacer 280 and the upper TSV spacer 380 may be discontinuous. Only a portion of the lower TSV spacer 280 and the upper TSV spacer 130 may overlap in the vertical direction. The insulating layers 241, 243, 245, and 248 of the intermediate device 200A and the insulating layers 341, 343, 345, and 348 of the upper device 300A may be interposed between the lower TSV spacer 280 and the upper TSV spacer 380.

The transistors 310 may include transistor insulating layers 311 and transistor electrodes 312 on the upper substrate 301. The transistor insulating layers 311 may include silicon oxide or a metal oxide, and the transistor electrodes 312 may include a doped silicon, a metal, a metal silicide, or a metal compound.

The insulating layers 341, 343, and 345 may include a lower interlayer insulating layer 341, an intermediate interlayer insulating layer 343, and an upper interlayer insulating layer 345. To facilitate understanding, the lower interlayer insulating layer 341 is illustrated on an upper side to be close to the upper substrate 301, and the upper interlayer insulating layer 345 is illustrated on a lower side to be far from the upper substrate 301. The lower interlayer insulating layer 341 may cover the transistors 310. The intermediate interlayer insulating layer 343 may surround side surfaces of the metal layers 351, 352 and 353. The intermediate interlayer insulating layer 343 may be coplanar with the metal layers 351, 352, and 353. The intermediate interlayer insulating layer 343 may include silicon nitride or silicon oxide. The upper interlayer insulating layer 345 may cover the metal layers 351, 352, and 353, and the intermediate interlayer insulating layer 343. The lower interlayer insulating layer 341 and the upper interlayer insulating layer 345 may include silicon oxide, silicon nitride, or a combination thereof.

The metal layers 351, 352, and 353 may include upper cell metal layers 351 in the cell area CA to be arranged with the photodiodes 303, upper peripheral metal layers 352 in the peripheral area PA to be arranged with the transistors 310, and an upper TSV interconnection 353. The metal layers 351, 352, and 353 may include a metal or a metal compound.

The upper via plugs 361 and 363 perpendicularly pass through the upper metal layer 345 may include upper cell via plugs 361 connected to the upper cell metal layers 351, and an upper TSV via plug 363 connected to the upper TSV interconnection 353.

The upper bumps 371 and 373 may be formed on the upper interlayer insulating layer 345. The upper bumps 371 and 373 may include upper cell bumps 371 connected to the upper cell via plugs 361, and an upper TSV bump 373 connected to the upper TSV via plug 363.

The upper passivation layer 348 may surround side surfaces of the upper bumps 371 and 373, and be coplanar therewith. The upper passivation layer 348 may include silicon oxide to be bonded to the intermediate passivation layer 248 of the intermediate device 200A.

The anti-reflection layer 391 may be conformally formed on the entire upper surface of the upper substrate 301. The device capping layer 392 may be conformally formed on the entire anti-reflection layer 391. Each of the anti-reflection layer 391 and the device capping layer 392 may include one of silicon nitride, silicon oxide, or silicon oxynitride. The color filters 393 and the micro-lens 394 may include an organic material.

The TSV structure 400 may perpendicularly pass through the upper device 300A and the intermediate device 200A to be electrically connected to the lower TSV pad 173 of the lower device 100A. The TSV structure 400 may include a relatively wide upper portion 400U while passing through the upper device 300A, and a relatively narrow lower portion 400L while passing through the intermediate device 200A. A part of the upper TSV bump 373 of the upper device 300A may be exposed to a part of a bottom of the upper portion 400U. The upper portion 400U of the TSV structure 400 may be spaced apart from the bulk area of the upper substrate 301 by the upper TSV spacer 380 to be electrically insulated therebetween. Side surfaces of the upper portion 400U of the TSV structure 400 may be surrounded by and in direct contact with the lower interlayer insulating layer 341, the intermediate interlayer insulating layer 343, and the upper interlayer insulating layer 345. The lower portion 400L of the TSV structure 400 may be spaced apart from the bulk area of the intermediate substrate 201 by the lower TSV spacer 280 to be electrically insulated therebetween. Side surfaces of the lower portion 400L of the TSV structure 400 may be surrounded by and in direct contact with the upper passivation layer 348 which is in the upper device 300A, the intermediate passivation layer 248, the upper interlayer insulating layer 245, the intermediate interlayer insulating layer 243, the lower interlayer insulating layer 241, and the back surface passivation layer 249 which are in the intermediate device 200A, and the lower passivation layer 148 of the lower device 100A. The lower portion 400L of the TSV structure 400 may be in direct contact with the lower TSV pad 173 of the lower device 100A. The TSV structure 400 may include a TSV plug 420 and a TSV barrier layer 410 which surrounds the TSV plug 420.

Figure 1B:
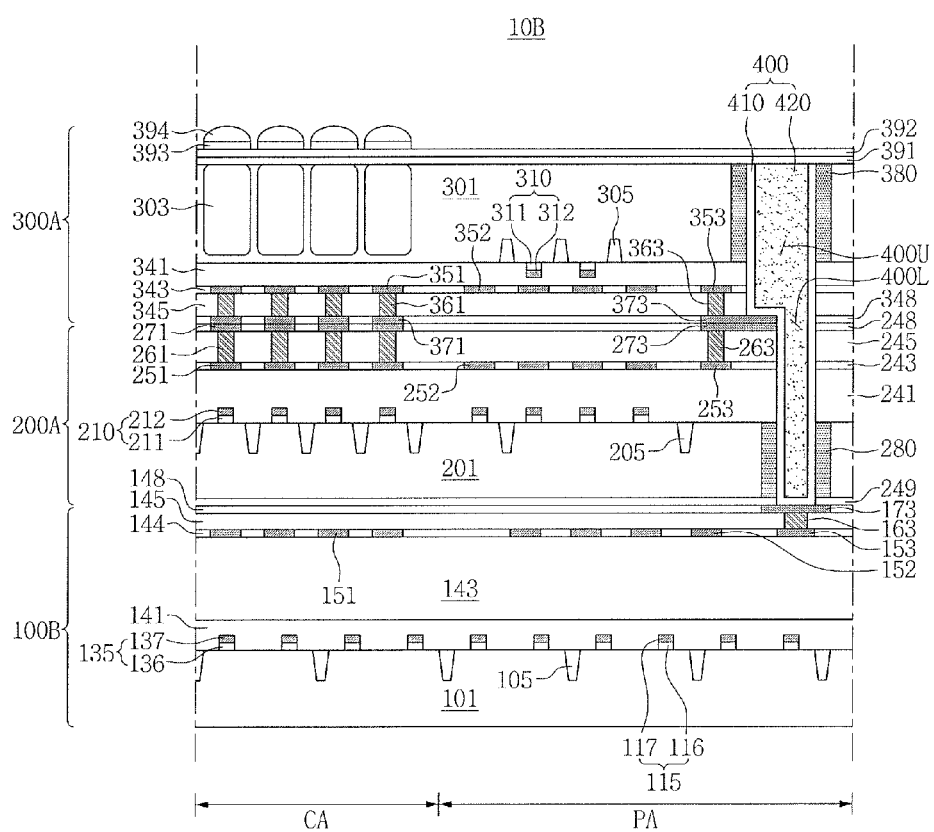

Referring to FIG. 1B, in accordance with one embodiment, a multi-stacked device 10B may include a lower device 100B, the intermediate device 200A, and the upper device 300A, wherein the lower device 100B may include a static random access memory (SRAM). Therefore, the lower device 100B may include a plurality of cell gate structures 135 in a cell area CA. The cell gate structures 135 may form a SRAM cell. Each of the cell gate structures 135 may include a cell gate insulating layer 136 and a cell gate electrode 137. The cell gate structures 135 may include an NMOS and a PMOS, and configure various logic circuits. Other elements not described may be understood with reference to FIG. 1A.

Figure 1C:
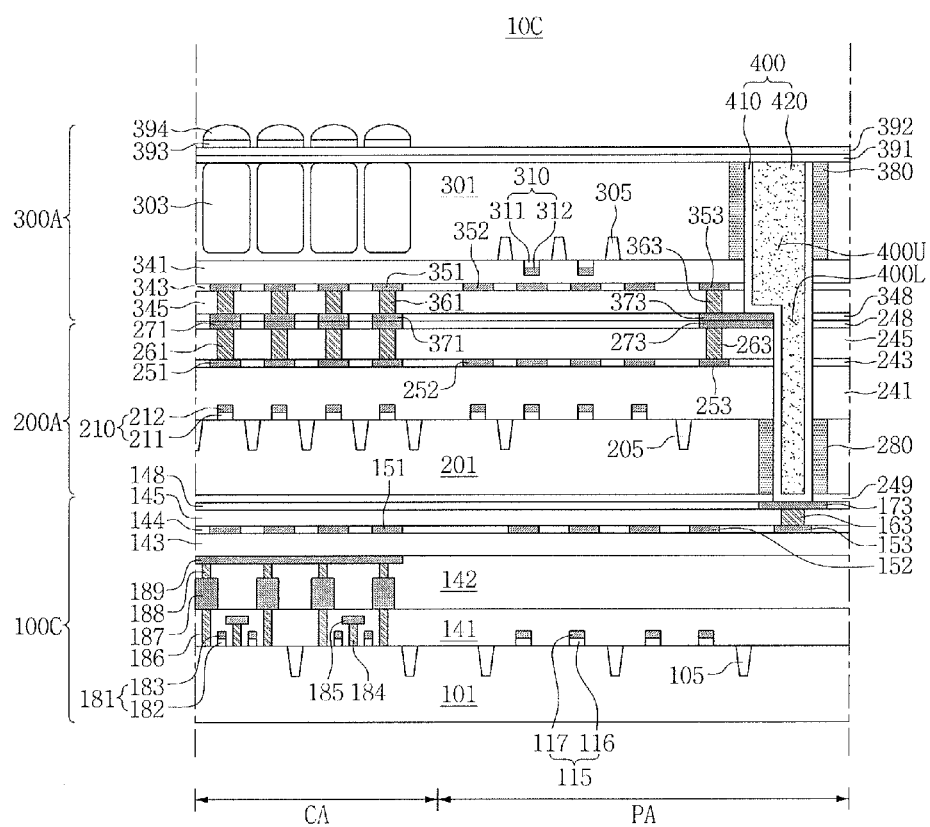

Referring to FIG. 1C, a multi-stacked device 10C in accordance with one embodiment may include a lower device 100C, the intermediate device 200A, and the upper device 300A, wherein the lower device 100C may include a magneto-resistive random access memory (MRAM). Accordingly, the lower device 100C may include cell gates 181, a source contact 184 and a source interconnection 185, a cell lower electrode 186, a magneto-resistive cell 187, an upper electrode 188, and a bit line interconnection 189. Each of the cell gates 181 may include a cell gate insulating layer 182 and a cell gate electrode 183. Other elements not described may be understood with reference to FIG. 1A.

Figure 1D:
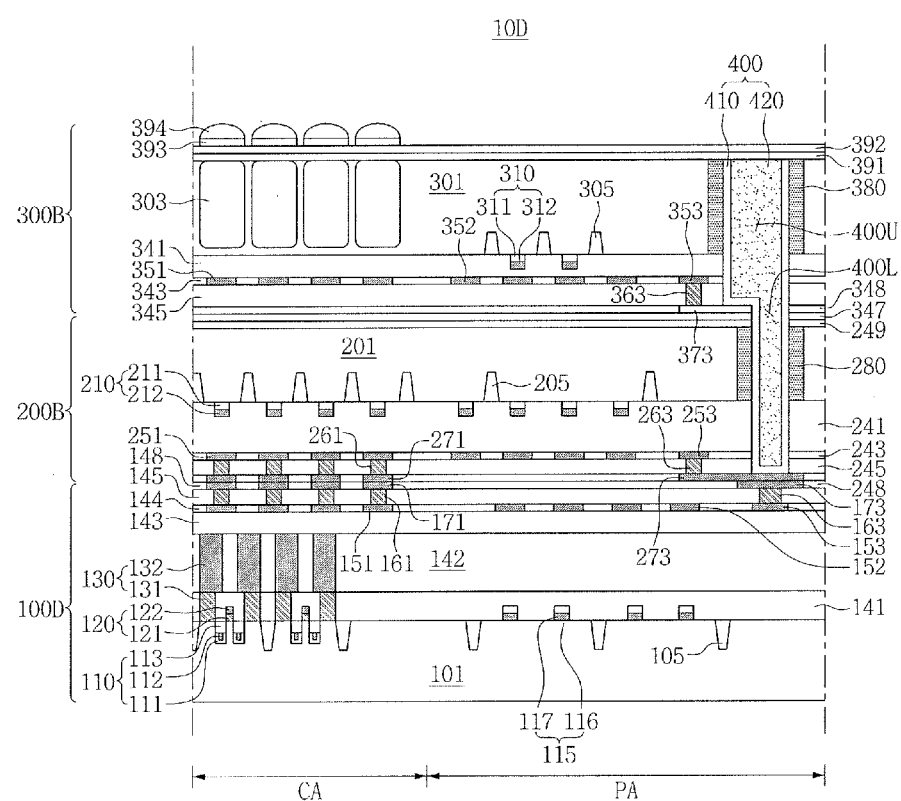

Referring to FIG. 1D, a multi-stacked device 10D in accordance with one embodiment may include a lower device 100D, an intermediate device 200B, and an upper device 300B. The lower device 100D and the intermediate device 200B may be bonded by a plurality of bumps 171, 173, 271, and 273. For example, the intermediate device 200B may be inverted as compared with the intermediate device 200A illustrated in FIGS. 1A to 1C.

The lower device 100D may further include lower cell via plugs 161 that perpendicularly pass through an upper interlayer insulating layer 145 to be connected with a lower cell metal layer 151, and lower cell bumps 171 on lower cell via plugs 161 as compared with the lower device 100A illustrated in FIG. 1A. A lower passivation layer 148 may surround side surfaces of the lower cell bumps 171. The lower cell bumps 171 and the intermediate cell bumps 271 may be in direct contact with each other and bonded.

An intermediate TSV bump 273 of the intermediate device 200B may be in direct contact with and bonded to a lower TSV pad 173. Accordingly, a bottom of a lower portion 400L of a TSV structure 400 may be in direct contact with an upper surface of the intermediate TSV bump 273.

The upper device 300B may further include a buffer layer 347 on an upper passivation layer 348. The upper passivation layer 348 and the buffer layer 347 may include silicon oxide, silicon nitride, or a combination thereof.

Figure 1E:
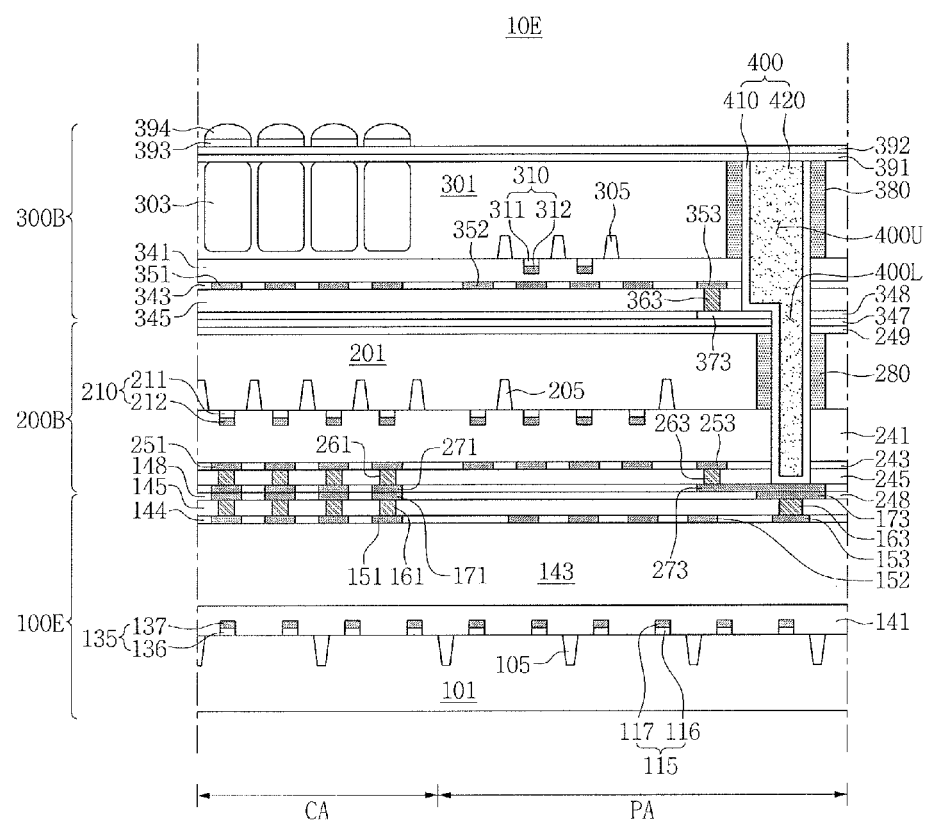

Referring to FIG. 1E, a multi-stacked device 10E in accordance with one embodiment may include a lower device 100E, the intermediate device 200B, and the upper device 300B. The lower device 100E may include an SRAM. Other elements not described may be understood with reference to FIG. 1D.

Figure 1F:
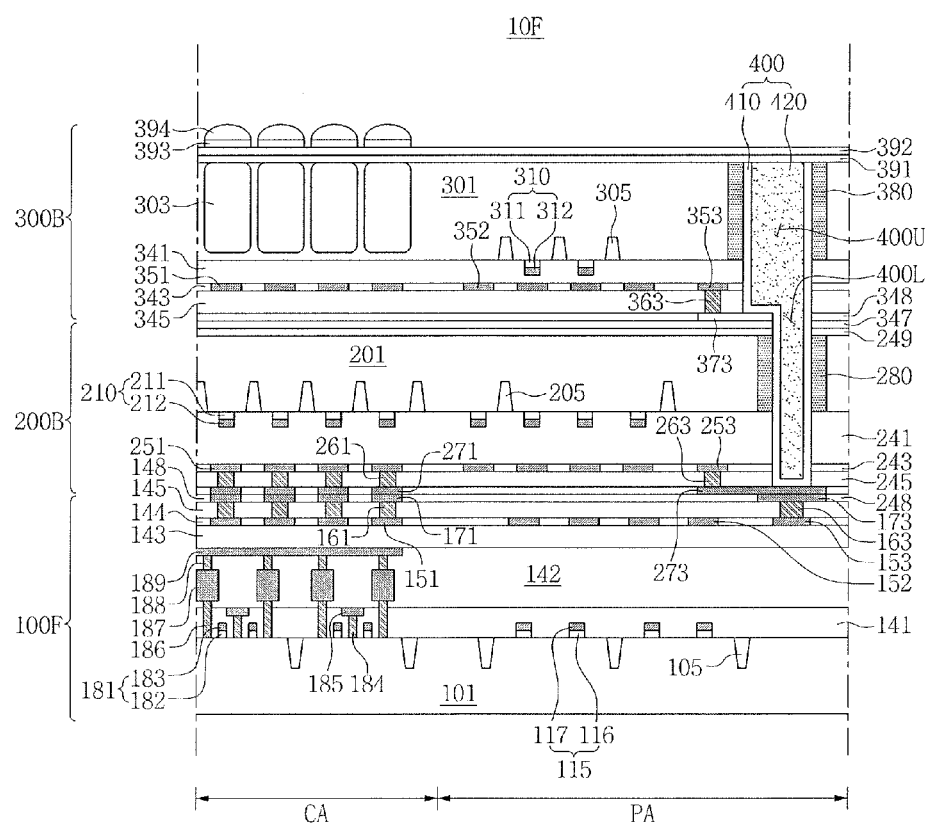

Referring to FIG. 1F, a multi-stacked device 10F in accordance with one embodiment may include a lower device 100F, the intermediate device 200B, and the upper device 300B. The lower device 100F may include an MRAM. Other elements not described may be understood with reference to FIG. 1D.

Figure 2A:
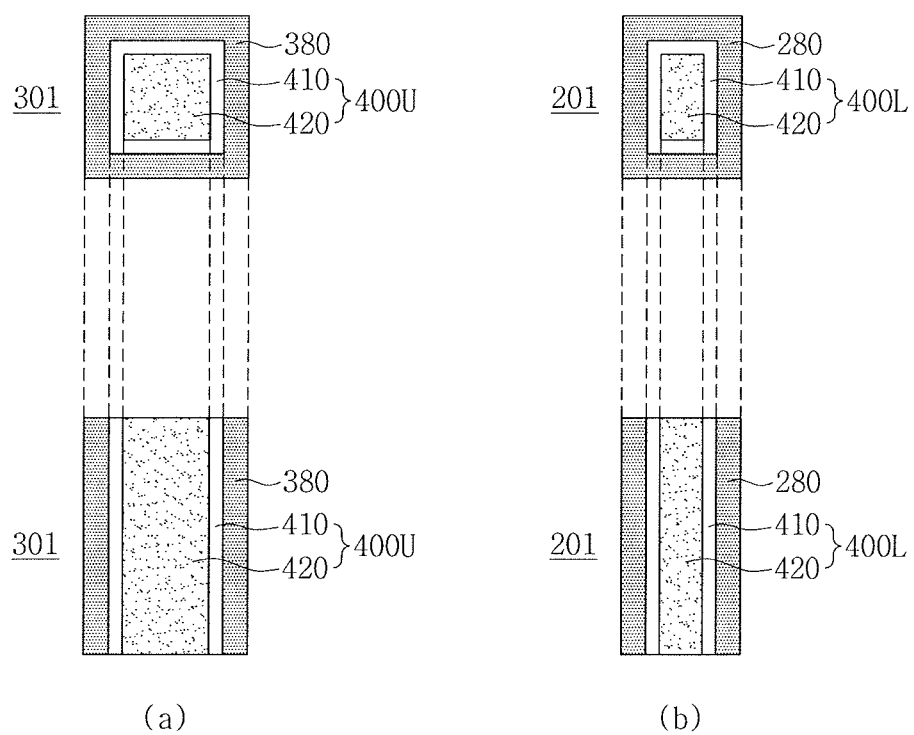
FIGS. 2A to 2C illustrate cross-sectional views and longitudinal sectional views of a through-silicon via (TSV)
Figure 2B:
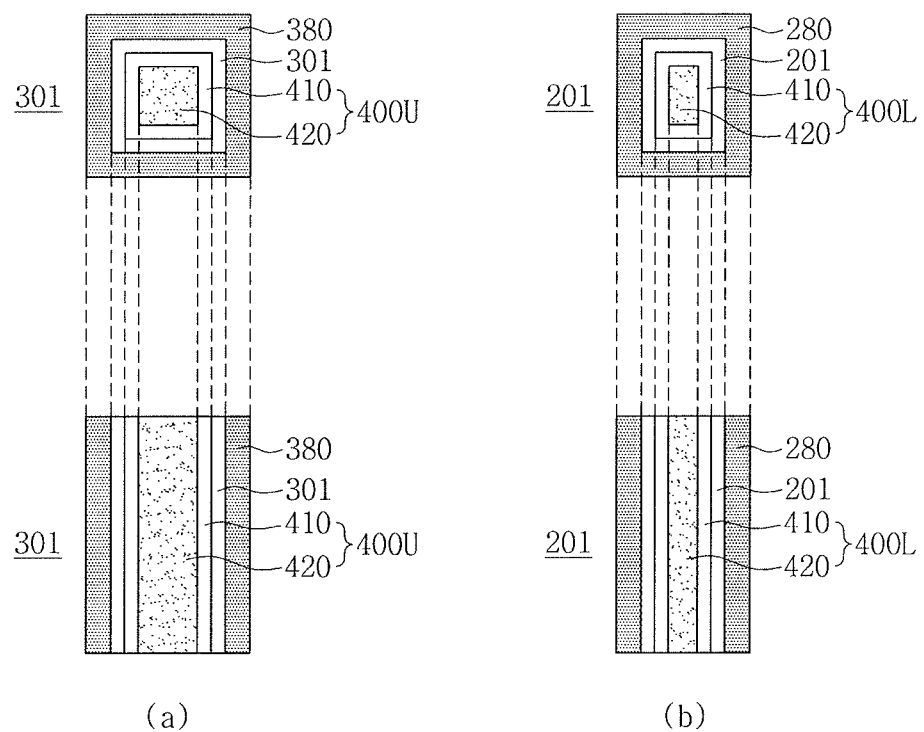
Figure 2C:
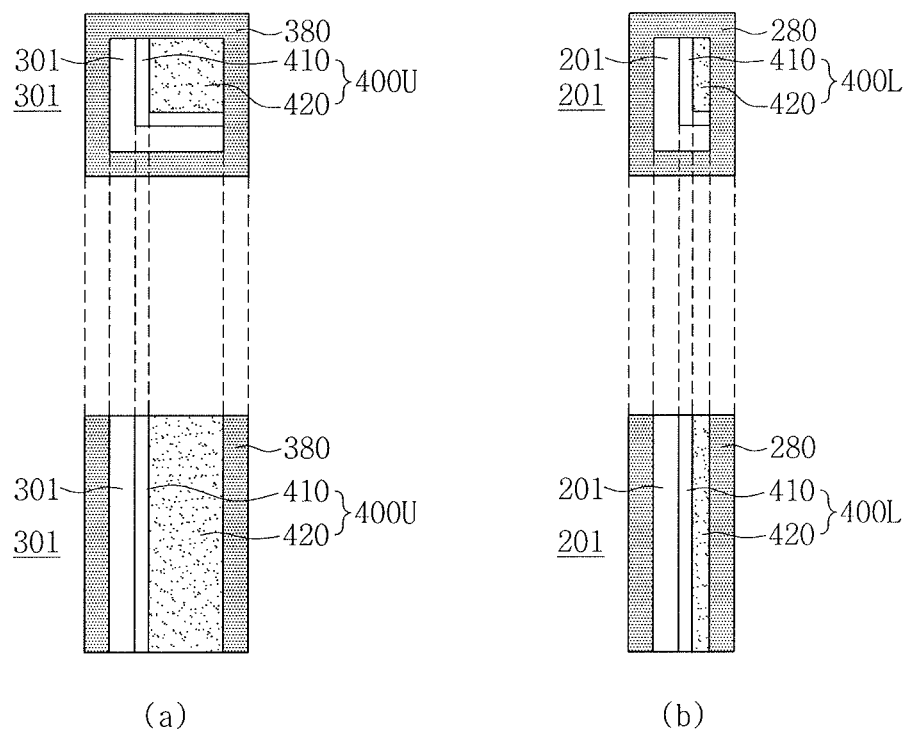

FIGS. 2A to 2C are cross-sectional views and longitudinal sectional views of the TSV structure 400 according to various embodiments, which are taken along lines I-I' and II-II' of FIG. 1A. As may be seen therein, the upper TSV spacer 380 may be continuous in plan view and may completely surround the upper portion 400U of the TSV structure adjacent the upper substrate 301. The lower TSV spacer 280 may be continuous in plan view and may completely surround the lower portion 400L of the TSV structure adjacent to intermediate substrate 201. As also may be seen therein, the upper TSVs pacer 380 may be wider in a first direction orthogonal to the stacking direction than the lower TSV spacer 280, but may have a same width in a second direction, orthogonal to the first direction and the stacking direction.

Referring to FIG. 2A, the upper portion 400U and the lower portion 400L of the TSV structure 400 may be in contact, e.g., direct contact, with the upper TSV spacer 380 and the lower TSV spacer 280, respectively.

Referring to FIG. 2B, the upper portion 400U and the lower portion 400L of the TSV structure 400 may be spaced apart from the upper TSV spacer 380 and the lower TSV spacer 280. A part of the upper substrate 301 and/or the intermediate substrate 201 may be in the space between the TSV structure 400, and the upper and lower TSV spacers 380 and 280, respectively.

Referring to FIG. 2C, a part of the upper portion 400U and the lower portion 400L of the TSV structure 400 may be spaced apart from the upper TSV spacer 380 and the lower TSV spacer 280, and another part may be in contact, e.g., direct contact, therewith.

Referring again to FIG. 2A to 2C, it should be fully understood that the TSV structure 400 and the upper and the lower TSV spacers 380 and 280 may be formed in various shapes. In all cases, the TSV structure 400 may be electrically insulated from the bulk areas of the upper substrate 301 and the intermediate substrate 201 by the upper and lower TSV spacers 380 and 280.

FIGS. 3A to 3C illustrate stages in a method of forming a lower device 100A according to one embodiment. FIGS. 4A to 4G illustrate stages in a method of forming an intermediate device 200A according to one embodiment. FIGS. 5A to 5G illustrate stages in a method of forming an upper device 300A according to one embodiment. FIGS. 6A to 6D illustrate stages in a method of forming the multi-stacked device 10A by stacking the lower device 100A, the intermediate device 200A, and the upper device 300A according to one embodiment.

Referring to FIG. 3A, the method of forming a lower device 100A in accordance with one embodiment may include forming a plurality of isolation regions 105 and buried cell gate structures 110 in the lower substrate 101, and forming peripheral gate structures 115, bit line structures 120, the lower interlayer insulating layer 141, the molding insulating layer 142, and storage structures 130 on the lower substrate 101. The cell gate structures 110, the bit line structures 120, and the storage structures 130 may be formed in a cell area CA, and the peripheral gate structures 115 may be formed in a peripheral area PA.

Forming the isolation regions 105 may include forming a trench in the lower substrate 101 and filling silicon oxide in the trench.

Forming of the buried cell gate structures 110 may include forming gate trenches in the lower substrate 101, conformally forming cell gate insulating layers 111 on inner walls of lower parts of the gate trenches, forming cell gate electrodes 112 which fill lower parts of the gate trenches on the cell gate insulating layers 111, and forming cell gate capping layers 113 which fill the gate trenches on the cell gate insulating layers 111 and the cell gate electrodes 112. The cell gate insulating layers 111 may include silicon oxide or a metal oxide, and be formed using an oxidation process, a chemical vapor deposition (CVD) process, or an atomic layer deposition (ALD) process. The cell gate electrodes 112 may include a metal or metal compound, and be formed using a physical vapor deposition (PVD) process, a CVD process, or a plating process. The cell gate capping layers 113 may include silicon nitride or silicon oxide, and be formed using a CVD process.

Forming the peripheral gate structures 115 may include forming an insulating layer and a conductive layer on the lower substrate 101, and forming peripheral gate insulating layers 116 and peripheral gate electrodes 117 by performing a photolithography process and an etching process. The peripheral gate insulating layers 116 may include silicon oxide or a metal oxide, and be formed using a CVD process and an ALD process. The peripheral gate electrodes 117 may include a metal or a metal compound, and be formed using a CVD process.

Forming the bit line structures 120 may include forming conductive bit line contact plugs 121 on the lower substrate 101, and forming bit line electrodes 122 on the bit line contact plugs 121. The bit line contact plugs 121 may include a doped silicon, a metal or a metal compound, and be formed using an epitaxial growth process, a CVD process or a PVD process. The bit line electrodes 122 may include a metal or a metal compound, and be formed using a CVD process or a PVD process.

Forming the storage structures 130 may include forming storage contact plugs 131 which pass through the lower interlayer insulating layer 141 to be connected to the lower substrate 101, and forming storage nodes 132 in the molding insulating layer 142.

The forming of the lower interlayer insulating layer 141 and the molding insulating layer 142 may include performing a CVD process or a coating process to form silicon oxide.

Referring to FIG. 3B, the method of forming the lower device 100A may include forming the intermediate interlayer insulating layer 143, the capping insulating layer 144, metal layers 151 to 153, and the upper interlayer insulating layer 145 on the molding insulating layer 142 and the storage nodes 132. The intermediate interlayer insulating layer 143 may include silicon oxide. The capping insulating layer 144 may include an insulating material denser than that in the intermediate interlayer insulating layer 143, e.g., silicon nitride. The capping insulating layer 144 may surround side surfaces of the metal layers 151 to 153 and be coplanar with the metal layers 151 to 153. The metal layers 151 to 153 may include a lower cell metal layer 151 in the cell area CA, and a lower peripheral metal layer 152 and a lower TSV interconnection 153 in the peripheral area PA. The metal layers 151 to 153 may include a metal or a metal compound formed using a CVD process. The upper interlayer insulating layer 145 may include silicon oxide or silicon nitride. The intermediate interlayer insulating layer 143, the capping insulating layer 144, and the upper interlayer insulating layer 145 may be formed using a CVD process.

Referring to FIG. 3C, the method of forming the lower device 100A may include forming a lower TSV via plug 163 which vertically passes through the upper interlayer insulating layer 145 to be connected to the lower TSV interconnection 153, and forming a lower TSV pad 173 on the lower TSV via plug 163. The lower TSV via plug 163 and the lower TSV pad 173 may include a metal or a metal compound. The method of forming the lower device 100A may further include forming a lower passivation layer 148 which is coplanar with the lower TSV pad 173 using a CVD process and a chemical-mechanical polishing (CMP) process. The lower passivation layer 148 may include silicon oxide.

Figure 4A:
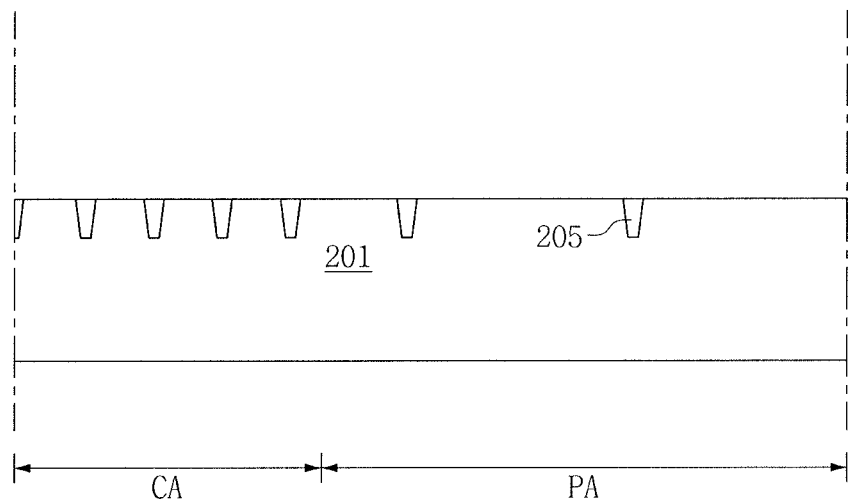

Referring to FIG. 4A, the method of forming an intermediate device 200A in accordance with one embodiment may include forming a plurality of isolation regions 205 in the intermediate substrate 201. Formation of the isolation regions 205 may include forming trenches in the intermediate substrate 201 and filling silicon oxide in the trenches.

Figure 4B:
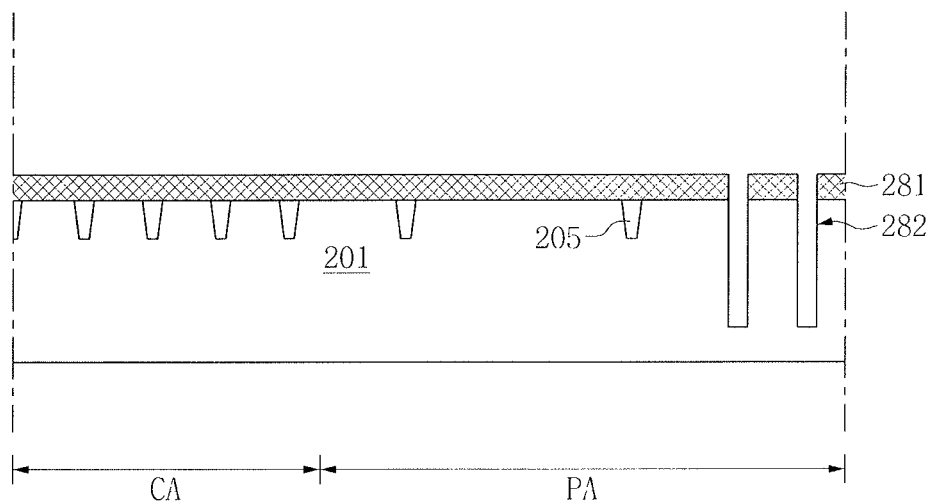

Referring to FIG. 4B, the method of forming the intermediate device 200A may include forming a lower trench mask 281 on the intermediate substrate 201, and forming a lower TSV trench 282 by performing an etching process using the lower trench mask 281 as an etch mask. The lower TSV trench 282 may be deeper than the trenches of the isolation regions 205, e.g., may be longer in the stacking direction. The lower trench mask 282 may include one or more of a photoresist, silicon oxide, and silicon nitride. Then, the lower trench mask 281 may be removed. The lower TSV trench 282 may have a tetragonal shape or a circular shape in a top view. That is, the two trenches shown in the drawing may be spatially connected to each other (see, e.g., FIGS. 2A to 2C).

Figure 4C:
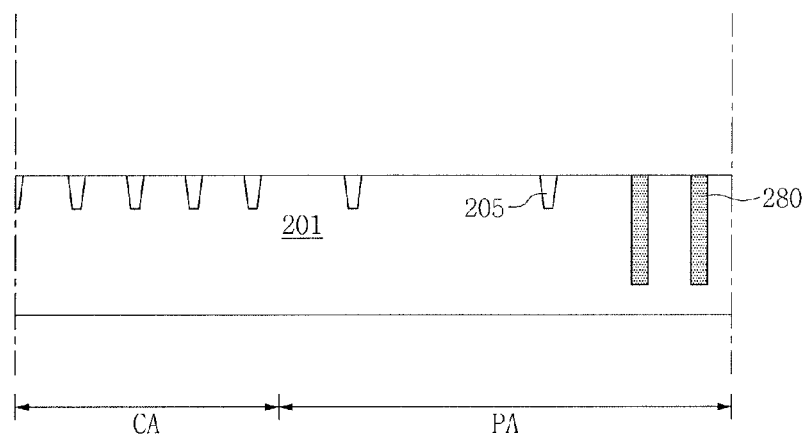

Referring to FIG. 4C, the method of forming the intermediate device 200A may include filling an insulating material in the lower TSV trench 282 to form a lower TSV spacer 280. The lower TSV spacer 280 may include an insulating material, e.g. silicon oxide or silicon nitride, filled in the lower TSV trench 282 using a CVD process, an ALD process, or a coating process. Then, the method may further include performing a planarization process such as a CMP so that the intermediate substrate 201 is coplanar with the lower TSV spacer 280.

Figure 4D:
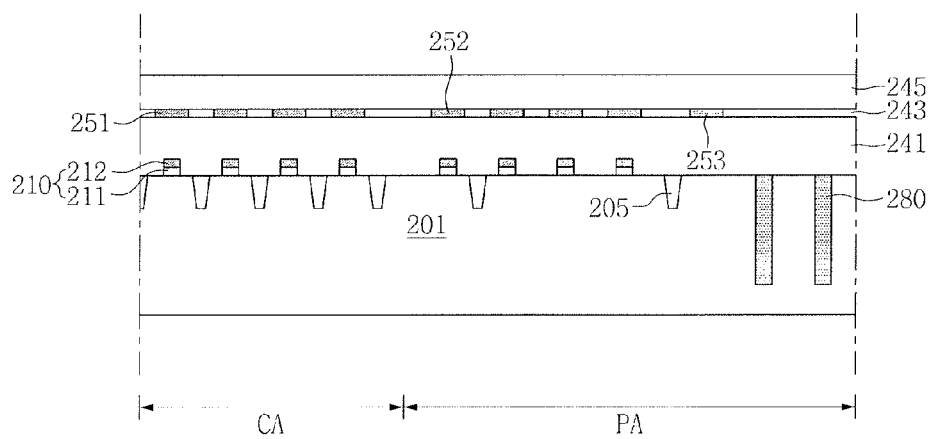

Referring to FIG. 4D, the method of forming the intermediate device 200A may include forming logic gate structures 210, interlayer insulating layers 241, 243, and 245, and metal layers 251 to 253 on the intermediate substrate 201. Each of the logic gate structures 210 may include a logic gate insulating layer 211 and a logic gate electrode 212. The logic gate insulating layer 211 may include silicon oxide or a metal oxide formed using a CVD process. The logic gate electrode 212 may include a metal oxide or a metal formed using a CVD process. The metal layers 251 to 253 may include an intermediate cell metal layer 251, an intermediate peripheral metal layer 252, and an intermediate TSV interconnection 253. The metal layers 251 to 253 may include a metal or a metal compound formed using a CVD process. The interlayer insulating layers 241, 243, and 245 may include a lower interlayer insulating layer 241 which covers the logic gate structures 210, an intermediate interlayer insulating layer 243 which surrounds side surfaces of the metal layers 251 to 253 and is coplanar with the metal layers 251 to 253, and an upper interlayer insulating layer 245. The lower interlayer insulating layer 241, the intermediate interlayer insulating layer 243, and the upper interlayer insulating layer 245 may include silicon oxide or silicon nitride formed using a CVD process.

Figure 4E:
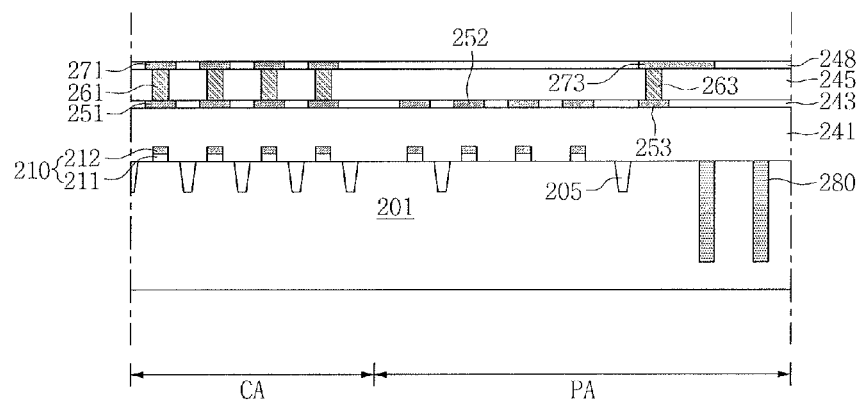

Referring to FIG. 4E, the method of forming the intermediate device 200A may include forming intermediate via plugs 261 and 263 which perpendicularly pass through the upper interlayer insulating layer 245 to be electrically connected to the intermediate cell metal layers 251 and the intermediate TSV interconnection 253 respectively, forming intermediate bumps 271 and 273 on the intermediate via plugs 261 and 263, and forming an intermediate passivation layer 248 which surrounds side surfaces of the intermediate bumps 271 and 273, and is coplanar with the intermediate bumps 271 and 273. The intermediate via plugs 261 and 263 may include an intermediate cell via plug 261 and an intermediate TSV via plug 263. The intermediate bumps 271 and 273 may include intermediate cell bumps 271 and an intermediate TSV bump 273. The intermediate bumps 271 and 273 may include a metal or a metal compounds. The intermediate passivation layer 248 may include silicon oxide.

Figure 4F:
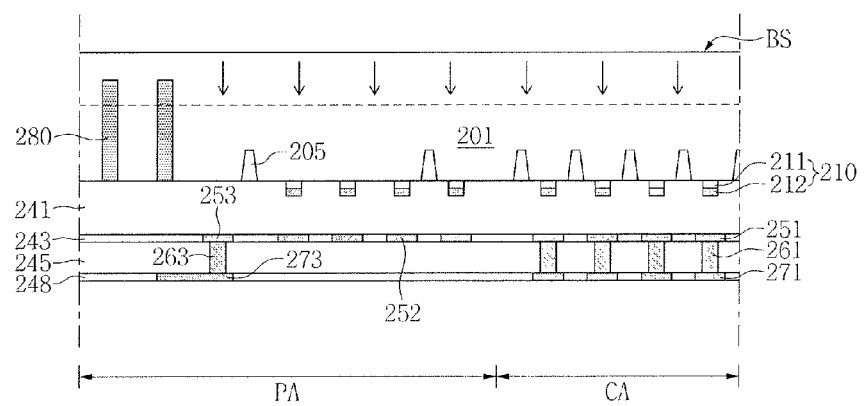

Referring to FIG. 4F, the method of forming the intermediate device 200A may include inverting and reversing the intermediate substrate 201 and recessing a back surface BS of the intermediate substrate 201. A lower end portion of the lower TSV spacer 280 may be exposed. In the process, the lower end portion of the lower TSV spacer 280 may also be removed partially. Recessing the back surface BS of the intermediate substrate 201 may include a grinding process, a CMP process, or an etching process.

Figure 4G:
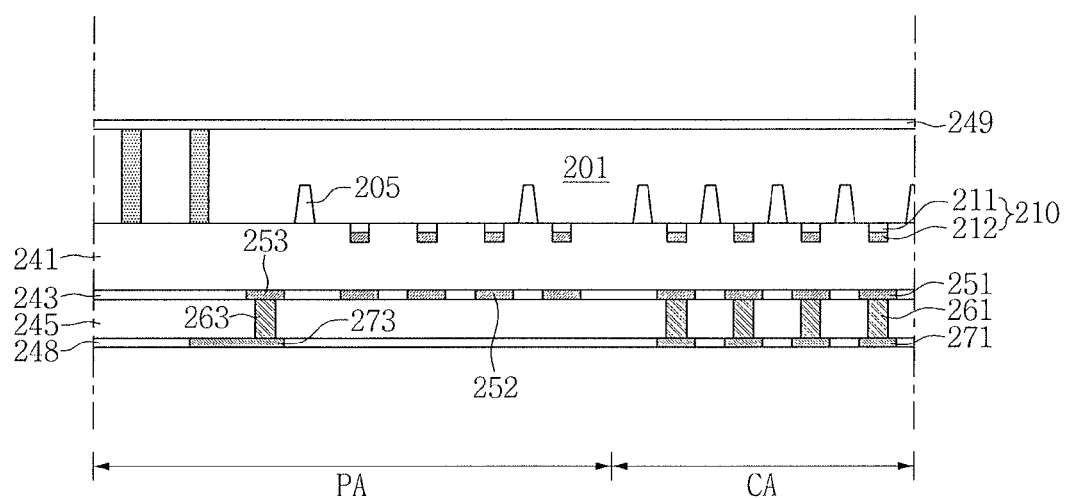

Referring to FIG. 4G, the method of forming the intermediate device 200A may include forming a back surface passivation layer 249 on the recessed back surface BS of the intermediate substrate 201. The back surface passivation layer 249 may include silicon oxide formed using a CVD process. Then, the method may include inverting the intermediate substrate 201 again. The intermediate device 200A may include a logic device, e.g., a microprocessor.

Figure 5A:
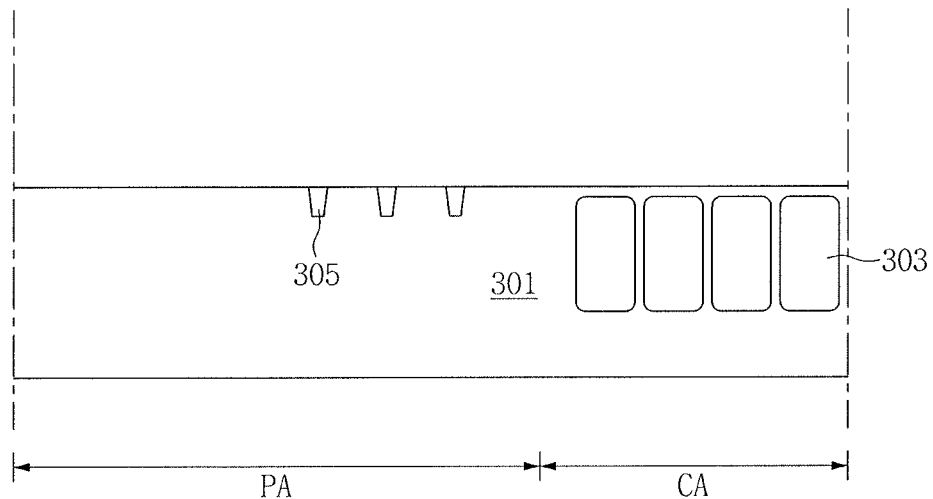

Referring to FIG. 5A, the method of forming an upper device 300A in accordance with one embodiment may include forming photodiodes 303 and isolation regions 305 in the upper substrate 301. The upper substrate 301 may include a semiconductor substrate including silicon, silicon germanium, or an SOI. The photodiodes 303 may include an n-doped region and a p-doped region. The isolation regions 305 may include silicon oxide and have an STI shape.

Figure 5B:
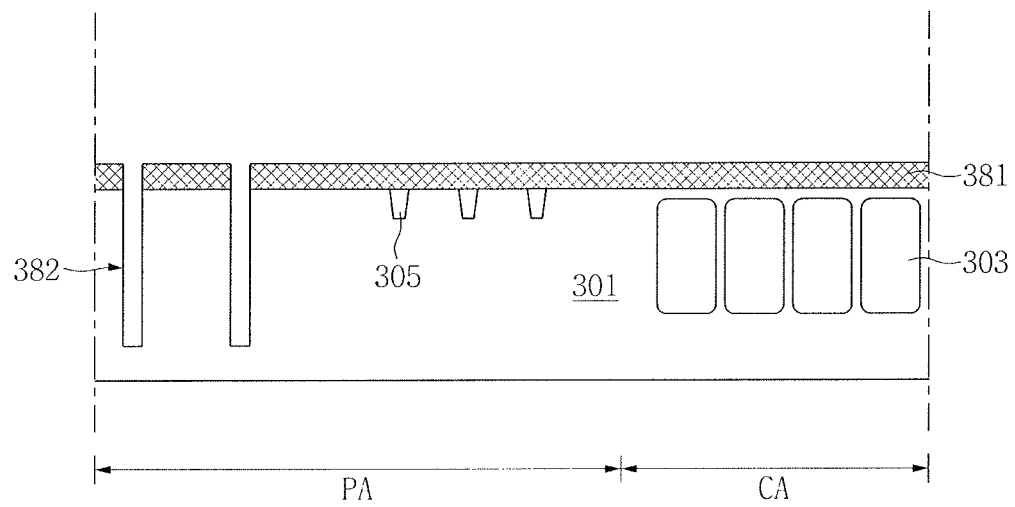

Referring to FIG. 5B, the method of forming the upper device 300A may include forming an upper trench mask 381 on the upper substrate 301 and forming an upper TSV trench 382 by performing an etching process using the upper trench mask 381 as an etch mask. The upper trench mask 381 may include one or more of a photoresist, silicon oxide and silicon nitride. Then, the upper trench mask 381 may be removed.

Figure 5C:
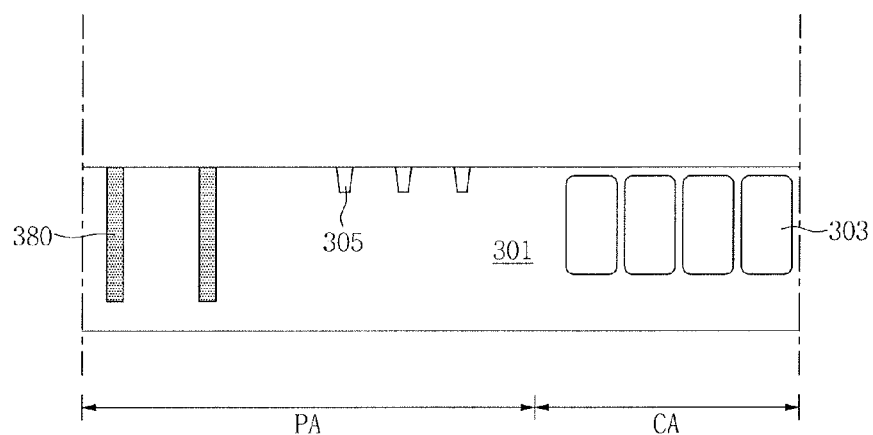

Referring to FIG. 5C, the method of forming the upper device 300A may include filling an insulating material in the upper TSV trench 382 to form an upper TSV spacer 380. The upper TSV spacer 380 may include an insulating material such as silicon oxide or silicon nitride formed using a CVD process or an ALD process. Then, the method may include performing a planarization process such as a CMP process so that the upper substrate 301 is coplanar with the upper TSV spacer 380. The upper TSV trench 382 may have a tetragonal shape or a circular shape in a top view. That is, the two trenches shown in the drawing may be spatially connected to each other (see, e.g., FIGS. 2A to 2C).

Figure 5D:
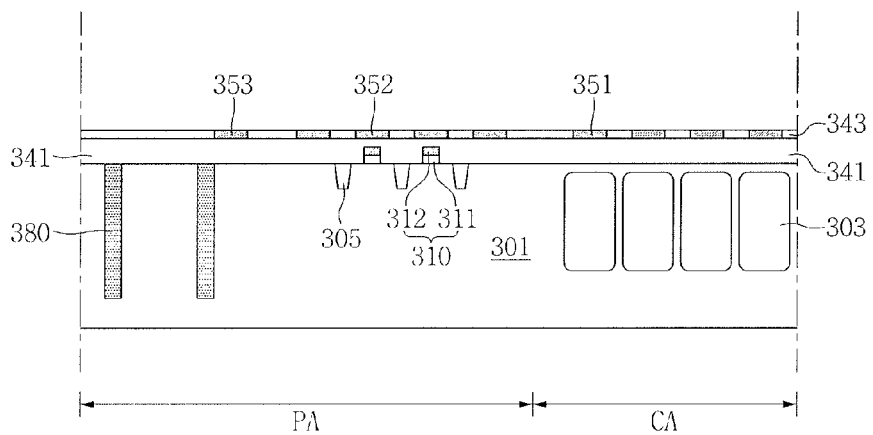

Referring to FIG. 5D, the method of forming the upper device 300A may include forming transistors 310 on the upper substrate 301, forming the lower interlayer insulating layer 341 which covers the transistors 310, forming metal layers 351 to 353 on the lower interlayer insulating layer 341, and forming an intermediate interlayer insulating layer 343 which surrounds side surfaces of the metal layers 351 to 353. The lower interlayer insulating layer 341 may include silicon oxide. The metal layers 351 to 353 may include an upper cell metal layer 351, an upper peripheral metal layer 352, and an upper TSV interconnection 353. The metal layers 351 to 353 may include a metal or a metal compound. The intermediate interlayer insulating layer 343 may include silicon nitride or silicon oxide. The intermediate interlayer insulating layer 343 may be coplanar with the metal layers 351 to 353.

Figure 5E:
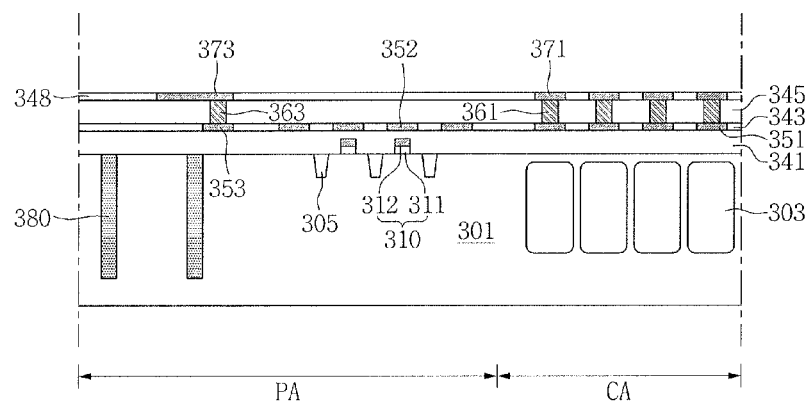

Referring to FIG. 5E, the method of forming the upper device 300A may include forming an upper interlayer insulating layer 345 on the metal layers 351 to 353 and the intermediate interlayer insulating layer 343, forming upper via plugs 361 and 363 which perpendicularly pass through the upper interlayer insulating layer 345, forming upper bumps 371 and 373 on the upper via plugs 361 and 363, and forming an upper passivation layer 348 which surrounds side surfaces of the upper bumps 371 and 373. The upper interlayer insulating layer 345 may include silicon oxide. The upper via plugs 361 and 363 may include upper cell via plugs 361 and an upper TSV via plug 363. The upper bumps 371 and 373 may include upper cell bumps 371 and an upper TSV bump 373. The upper via plugs 361 and 363, and the upper bumps 371 and 373 may include a metal or a metal oxide.

Figure 5F:
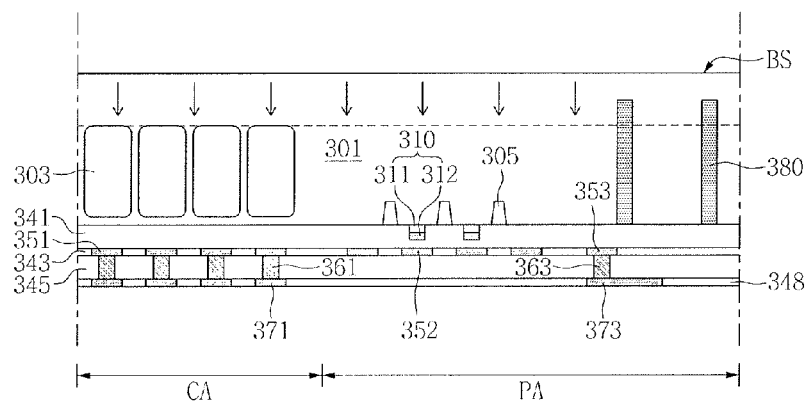

Referring to FIG. 5F, the method of forming the upper device 300A may include inverting the upper substrate 301 and recessing a back surface BS of the upper substrate 301. In the process, a lower end portion of the upper TSV spacer 380 may be exposed and partially removed. The recessing of the back surface BS of the upper substrate 301 may include a grinding process, a CMP process, or an etching process.

Figure 5G:
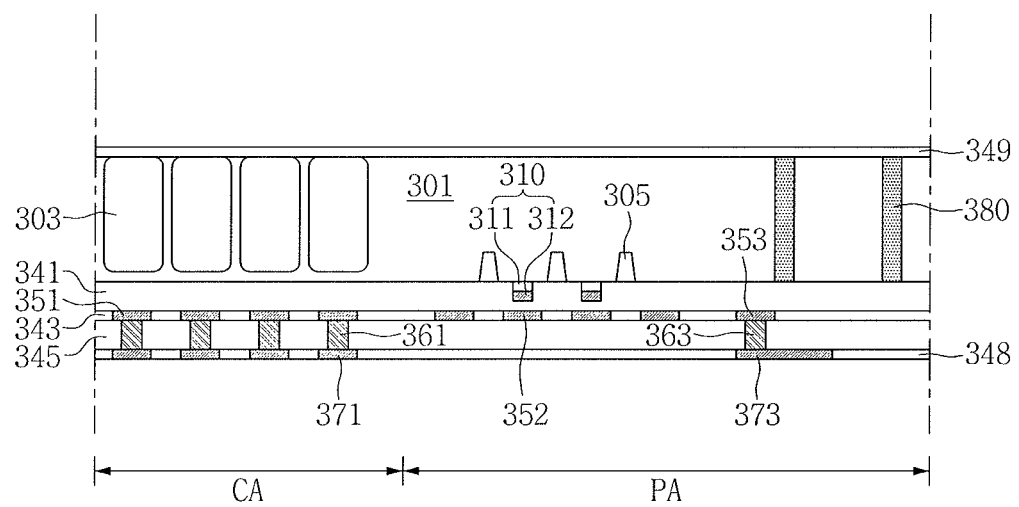

Referring to FIG. 5G, the method of forming the upper device 300A may include forming a wrapping layer 349 on the recessed back surface BS of the upper substrate 301. The wrapping layer 349 may include silicon oxide to be bonded to the intermediate device 200A.

Figure 6A:
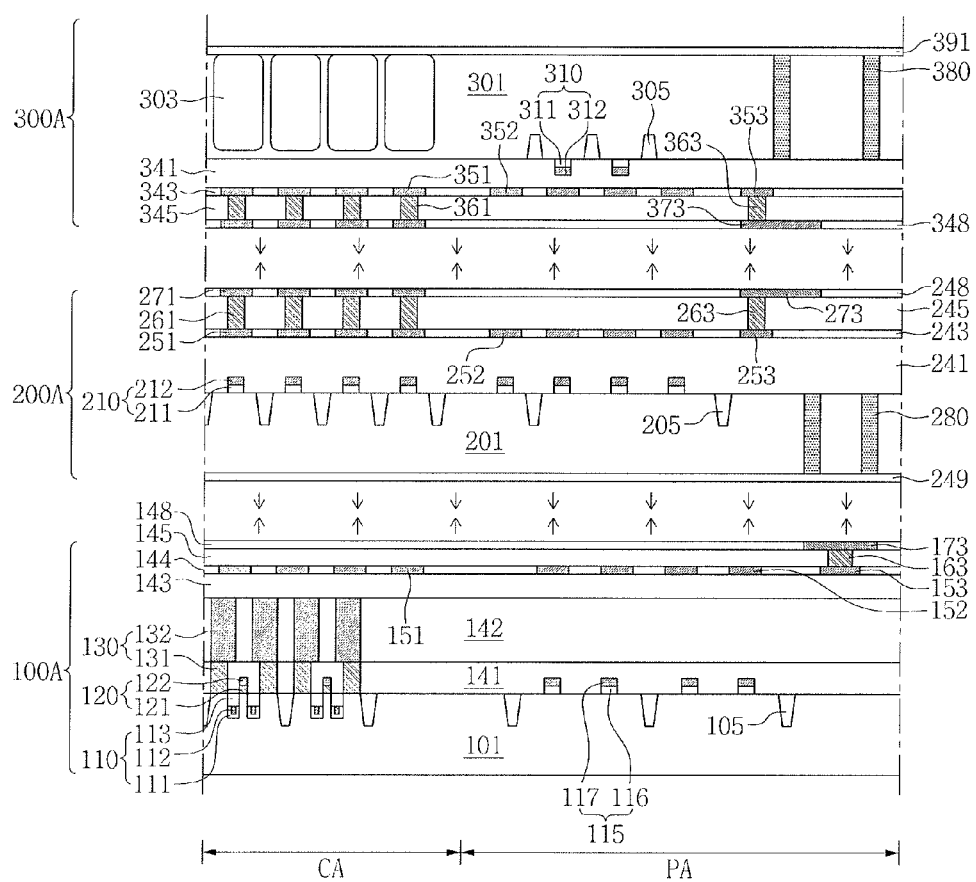

Referring to FIG. 6A, the method of forming a multi-stacked device 10A in accordance with one embodiment may include stacking the lower device 100A, the intermediate device 200A, and the upper device 300A in that order. A front surface of the lower device 100A and the back surface of the intermediate device 200A may be bonded, and a front surface of the intermediate device 200A and a front surface of the upper device 300A may be bonded. The front surfaces may refer to surfaces close to a surface on which the isolation regions 105, 205, and 305, the gate structures 110, 150, and 210, or the transistors 310 are formed, and the back surfaces may refer to surfaces opposite the front surfaces along the stacking direction.

Specifically, the lower passivation layer 148 of the lower device 100A and the back surface passivation layer 249 of the intermediate device 200A may be bonded, and the intermediate passivation layer 248 of the intermediate device 200A and the upper passivation layer 348 of the upper device 300A may be bonded. In this case, the lower TSV pad 173 of the lower device 100A and the lower TSV spacers 280 of the intermediate device 200A may be arranged, and the lower bumps 271 and 273 of the intermediate device 200A and the upper bumps 371 and 373 of the upper device 300A may be vertically arranged. In one embodiment, the lower bumps 271 and 273, and the upper bumps 371 and 373 may be bonded directly. For example, the lower cell bumps 271 and the upper cell bumps 371 may be directly arranged and bonded, and the lower TSV bump 273 and the upper TSV bump 373 may be directly arranged and bonded.

Figure 6B:
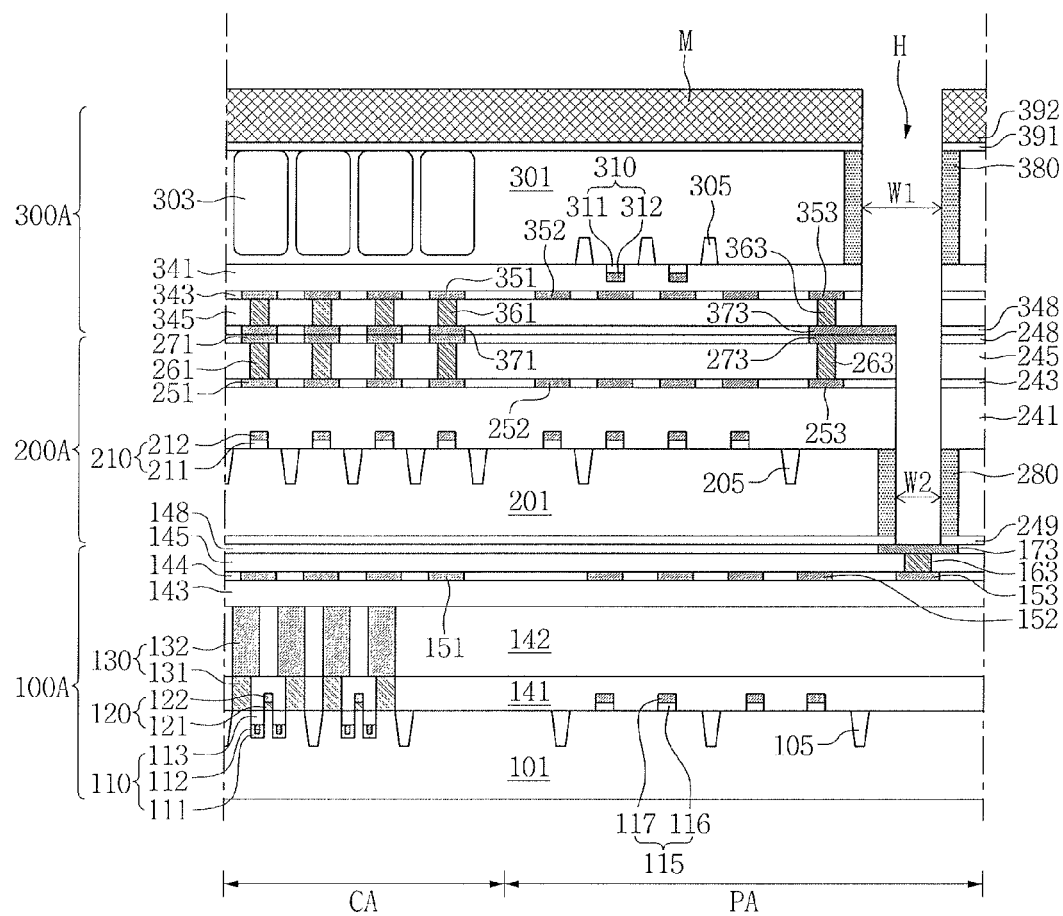

Referring to FIG. 6B, the method of forming the multi-stacked device 10A may include forming a TSV mask M on the surface of the upper device 300A, and forming a TSV hole H that passes through the upper substrate 301, the insulating layers 341, 343, 345, 348, and 349 of the upper device 300A, the insulating layers 241, 243, 245, 248 and 249 of the intermediate device 200B, and the intermediate substrate 201, to expose the lower TSV pad 173 of the lower device 100A by using an etching process using the TSV mask M as an etch mask.

The TSV mask M may include a photoresist, silicon oxide, silicon nitride, or a stacked layer thereof.

On an inner wall of the TSV hole H, the lower TSV spacer 280 and/or the upper TSV spacer 380 may be exposed. In the TSV hole H, the upper TSV bump 373 and the TSV pad 173 may be exposed. The upper portion of the TSV hole H which passes through the upper device 300A may be wider than the lower portion of TSV hole H which passes through the intermediate device 200A. In other words, the upper TSV bump 373 may serve as a mask for the lower portion of the TSV hole H.

Accordingly, a part of an upper surface of the upper TSV bump 373 may be exposed to a bottom of the upper portion of the TSV hole H, and a part of an upper surface of the lower TSV pad 173 may be exposed to a bottom of the lower portion of the TSV hole H. The lower substrate 101, the intermediate substrate 201, and the upper substrate 301 are not exposed in the TSV hole H. Then, the TSV mask M may be removed.

Figure 6C:
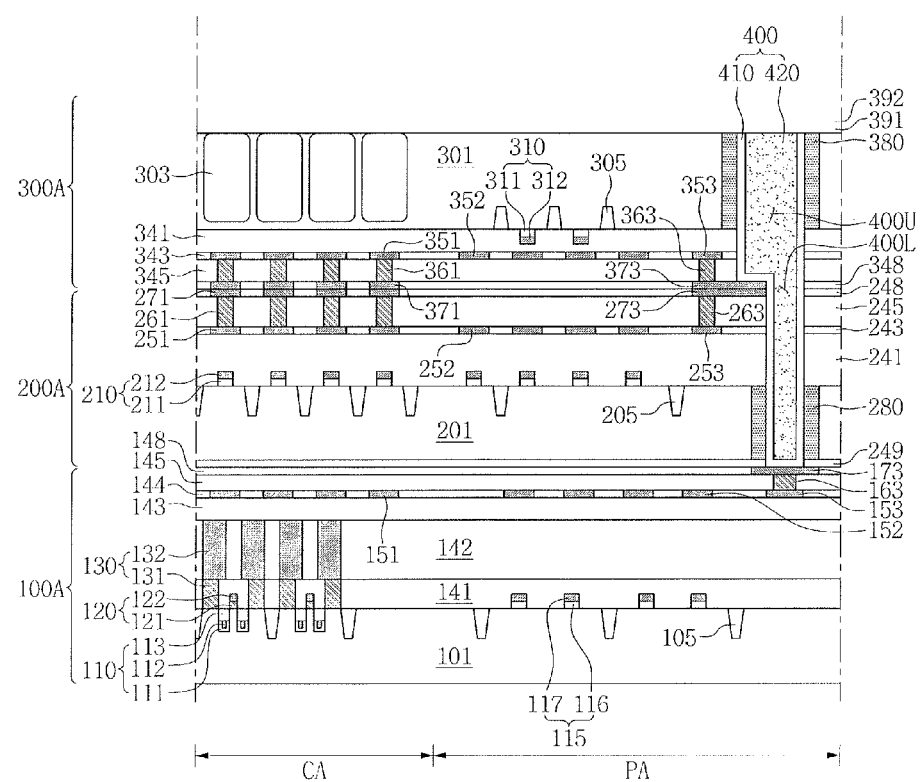

Referring to FIG. 6C, the method of forming the multi-stacked device 10A may include forming a TSV structure 400. More specifically, the method may include conformally forming a TSV barrier layer 410 on the inner wall of the TSV hole H, filling the TSV hole H with a metal, e.g., copper (Cu), to form a TSV plug 420, and performing a planarization process such as a CMP process, thereby forming the TSV structure 400 that includes the TSV barrier layer 410 and the TSV plug 420. The wrapping layer 349 may also be removed by the CMP process. The TSV barrier layer 410 may include a metal compound, e.g., titanium nitride (TiN) or tantalum nitride (TaN). The TSV plug 420 may include a metal, e.g., copper (Cu) or tungsten (W). The TSV barrier layer 410 may be formed using a PVD process or a CVD process, and the TSV plug 420 may be formed by a plating process, a PVD process, or a CVD process.

Figure 6D:
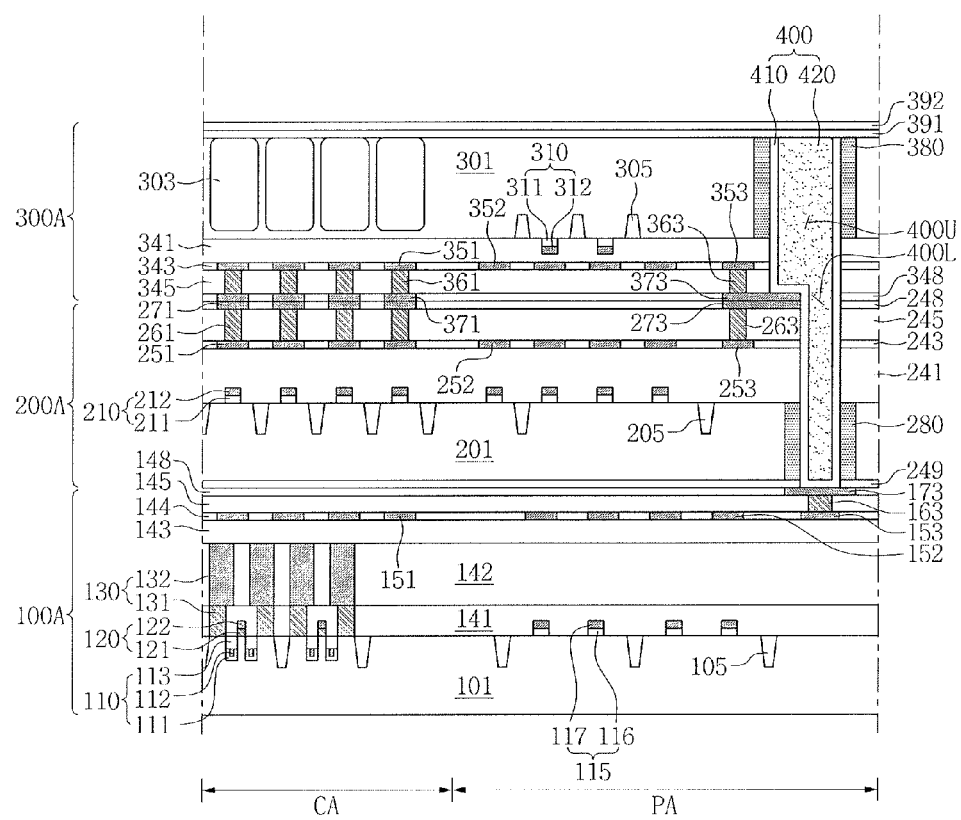

Referring to FIG. 6D, the method of forming the multi-stacked device 10A may include forming an anti-reflection layer 391 and a device capping layer 392 on the upper substrate 301. The anti-reflection layer 391 may include a silicon nitride layer, a silicon oxide layer, or a combination thereof. The device capping layer 392 may include a silicon oxide layer, a silicon nitride layer, or a combination thereof.

Then, referring to FIG. 1A, the method of forming the multi-stacked device 10A may include forming color filters 393 and micro lenses 394 on the device capping layer 392. The color filters 393 and the micro lenses 394 may include an organic material.

In accordance with embodiments, the multi-stacked semiconductor device can quickly and electrically stably operate since the TSV structure reliably electrically connects multi-stacked devices.

In accordance with embodiments, data and information can be transmitted quickly since the multi-stacked devices are directly bonded using bumps in the cell area.

In accordance with embodiments, TSV structures with a high aspect ratio can be electrically insulated from substrates since TSV spacers formed only in the substrates electrically insulate the TSV structures from the substrates.

In accordance with embodiments, a further fine TSV structure can be formed since any additional insulating layer is not formed in a TSV hole.

In accordance with embodiments, a hole not-open failure can be prevented and a contact resistance can be reduced since no additional insulating layer are formed in the TSV hole.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A multi-stacked device, comprising:
    a lower device including a lower substrate, a first insulating layer on the lower substrate, and a through-silicon via (TSV) pad on the first insulating layer;
    an intermediate device including an intermediate substrate, a second insulating layer on the intermediate substrate, and a first TSV bump on the second insulating layer;
    an upper device including an upper substrate, a third insulating layer on the upper substrate, and a second TSV bump on the third insulating layer; and
    a TSV structure passing through the upper substrate, the third insulating layer, the second insulating layer, and the intermediate substrate to be connected to the first TSV bump, the second TSV bump, and the TSV pad,
    wherein the intermediate device has an insulating first TSV spacer between the intermediate substrate and a lower portion of the TSV structure, the upper device has an insulating second TSV spacer between the upper substrate and an upper portion of the TSV structure, and a side surface of the TSV structure is in direct contact with the second insulating layer and the third insulating layer.

2. The multi-stacked device as claimed in claim 1, wherein the first TSV bump is in direct contact with the second TSV bump, and a part of a bottom of the upper portion of the TSV structure is in contact with a part of the second TSV bump.

3. The multi-stacked device as claimed in claim 1, wherein:
    the lower portion of the TSV structure passes through the intermediate substrate and the upper portion of the TSV structure passes through the upper substrate;
    a side surface of the lower portion of the TSV structure is in contact with the first TSV spacer; and
    a side surface of the upper portion of the TSV structure is in contact with the second TSV spacer.

4. The multi-stacked device as claimed in claim 1, wherein the lower device further includes:
    a lower TSV interconnection on the first insulating layer; and
    a lower TSV via plug perpendicularly connecting the lower TSV interconnection and the TSV pad.

5. The multi-stacked device as claimed in claim 1, wherein the intermediate device further includes:
    an intermediate TSV interconnection on the second insulating layer; and
    an intermediate TSV via plug perpendicularly connecting the intermediate TSV interconnection and the first TSV bump.

6. The multi-stacked device as claimed in claim 1, wherein the upper device further includes:
    an upper TSV interconnection on the third insulating layer; and
    an upper TSV via plug perpendicularly connecting the upper TSV interconnection and the second TSV bump.

7. The multi-stacked device as claimed in claim 1, wherein:
    the lower device further includes:
    a lower cell metal layer on the first insulating layer in a cell area;
    a lower cell via plug on the lower cell metal layer; and
    a lower cell bump on the lower cell via plug; and
    the intermediate device further includes:
    an intermediate cell metal layer on the second insulating layer in the cell area;
    an intermediate cell via plug on the intermediate cell metal layer; and
    an intermediate cell bump on the intermediate cell via plug,
    wherein the lower cell bump and the intermediate cell bump are connected electrically.

8. The multi-stacked device as claimed in claim 1, wherein:
    the intermediate device further includes:
    an intermediate cell metal layer on the second insulating layer in a cell area;
    an intermediate cell via plug on the intermediate cell metal layer; and
    an intermediate cell bump on the intermediate cell via plug; and
    the upper device further includes:
    an upper cell metal layer on the third insulating layer in the cell area;
    an upper cell via plug on the upper cell metal layer; and
    an upper cell bump on the upper cell via plug,
    wherein the intermediate cell bump and the upper cell bump are electrically connected.

9. The multi-stacked device as claimed in claim 1, wherein:
    the first TSV spacer electrically insulates the TSV structure from a bulk area of the intermediate substrate; and
    the second TSV spacer electrically insulates the TSV structure from a bulk area of the upper substrate.

10. A multi-stacked device, comprising:
    a lower device including a lower substrate, a plurality of first insulating layers on the lower substrate, and a through-silicon via (TSV) pad on the first insulating layers;

an intermediate device including an intermediate substrate, an insulating first TSV spacer passing through the intermediate substrate, a plurality of second insulating layers on the intermediate substrate, and a first TSV bump on the second insulating layers;

an upper device including an upper substrate, an insulating second TSV spacer passing through the upper substrate, a plurality of third insulating layers on the upper substrate, and a second TSV bump on the third insulating layers; and a TSV structure passing through the upper substrate, the plurality of third insulating layers, the plurality of second insulating layers, and the intermediate substrate to be in contact with the second TSV bump and the TSV pad, wherein:

the first TSV spacer electrically insulates the intermediate substrate from the TSV structure;

the second TSV spacer electrically insulates the upper substrate from the TSV structure; and the first TSV spacer and the second TSV spacer are spaced apart from each other.

11. The multi-stacked device as claimed in claim 10, wherein:

the first TSV spacer surrounds a lower portion of the TSV structure; and the second TSV spacer surrounds an upper portion of the TSV structure.

12. The multi-stacked device as claimed in claim 10, wherein:

the first insulating layers include a first lower interlayer insulating layer, a first intermediate interlayer insulating layer, and a first upper interlayer insulating layer;

the second insulating layers include a second lower interlayer insulating layer, a second intermediate interlayer insulating layer, and a second upper interlayer insulating layer;

the third insulating layers include a third lower interlayer insulating layer, a third intermediate interlayer insulating layer, and a third upper interlayer insulating layer;

a first end portion of the first TSV spacer is in contact with the second lower interlayer insulating layer, and a second end portion of the second TSV spacer is in contact with the third lower interlayer insulating layer.

13. The multi-stacked device as claimed in claim 12, wherein the TSV structure does not pass through the first insulating layers.

14. The multi-stacked device as claimed in claim 10, wherein:

the lower device further includes:

memory cells and a lower cell metal layer in a cell area;

a lower peripheral metal layer and a lower TSV interconnection in a peripheral area; and a lower TSV via plug perpendicularly connecting the lower TSV interconnection and the TSV pad;

the intermediate device further includes:

logic transistors and an intermediate cell metal layer in the cell area;

an intermediate peripheral metal layer and an intermediate TSV interconnection in the peripheral area; and an intermediate TSV via plug perpendicularly connecting the intermediate TSV interconnection and the first TSV bump; and the upper device further includes:

photodiodes and an upper cell metal layer in the cell area;

an upper peripheral metal layer and an upper TSV interconnection in the peripheral area; and an upper TSV via plug perpendicularly connecting the upper TSV interconnection and the second TSV bump.

15. The multi-stacked device as claimed in claim 14, wherein:

the intermediate device further includes:

an intermediate cell bump on the intermediate cell metal layer; and an intermediate cell via plug perpendicularly connecting the intermediate cell metal layer and the intermediate cell bump, and the upper device further includes:

an upper cell bump on the upper cell metal layer; and an upper cell via plug perpendicularly connecting the upper cell metal layer and the upper cell bump, wherein the intermediate cell bump and the upper cell bump are connected electrically.

16. The multi-stacked device as claimed in claim 14, wherein:

the lower device further includes:

a lower cell bump on the lower cell metal layer; and a lower cell via plug perpendicularly connecting the lower cell metal layer and the lower cell bump, and the intermediate device further includes:

an intermediate cell bump on the intermediate cell metal layer; and an intermediate cell via plug perpendicularly connecting the intermediate cell metal layer and the intermediate cell bump, wherein the lower cell bump and the intermediate cell bump are connected electrically.

17. The multi-stacked device as claimed in claim 10, wherein:

the TSV structure is in direct contact with an upper surface of the second TSV bump and an upper surface of the TSV pad; and an upper surface of the first TSV bump is in direct contact with a lower surface of the second TSV bump.

18. The multi-stacked device as claimed in claim 10, wherein:

the TSV structure is in direct contact with an upper surface of the first TSV bump and an upper surface of the second TSV bump; and a lower surface of the first TSV bump is in direct contact with an upper surface of the TSV pad.

19. The multi-stacked device as claimed in claim 10, wherein:

the TSV structure includes a relatively wide upper portion and a relatively narrow lower portion; and a part of a bottom of the upper portion is in direct contact with a part of an upper surface of the second TSV bump.

20. A multi-stacked device, comprising:

a lower device including a lower substrate, a first insulating layer on the lower substrate, and a through-silicon via (TSV) pad on the first insulating layer;

an intermediate device including an intermediate substrate, a second insulating layer on the intermediate substrate, and a first TSV bump on the second insulating layer;

an upper device including an upper substrate, a third insulating layer on the upper substrate, and a second TSV bump on the third insulating layer; and a TSV structure passing through the upper substrate, the third insulating layer, the second insulating layer, and the intermediate substrate to be electrically connected to the first TSV bump, the second TSV bump, and the TSV pad, wherein:

the intermediate device has an insulating first TSV spacer between the intermediate substrate and the TSV structure;

the upper device has an insulating second TSV spacer between the upper substrate and the TSV structure; and the third insulating layer is between the first TSV spacer and the second TSV spacer which are vertically spaced apart from each other.

* * * * *